US006998182B2

(12) United States Patent
Saitoh et al.

(10) Patent No.: US 6,998,182 B2
(45) Date of Patent: Feb. 14, 2006

(54) ORGANIC LUMINESCENCE DEVICE

(75) Inventors: Akihito Saitoh, Yokohama (JP); Yoichi Osato, Yokohama (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/385,460

(22) Filed: Mar. 12, 2003

(65) Prior Publication Data

US 2003/0232216 A1 Dec. 18, 2003

Related U.S. Application Data

(63) Continuation of application No. PCT/JP02/09673, filed on Sep. 20, 2002.

(30) Foreign Application Priority Data

Sep. 28, 2001 (JP) .............................. 2001-299530

(51) Int. Cl.
 *H05B 33/12* (2006.01)
(52) U.S. Cl. ...................... 428/690; 428/917; 313/504; 313/506
(58) Field of Classification Search ................ 428/690, 428/917; 313/504, 506
See application file for complete search history.

(56) References Cited

U.S. PATENT DOCUMENTS

| 4,539,507 A | 9/1985 | VanSlyke et al. ........... 313/504 |
| 4,720,432 A | 1/1988 | VanSlyke et al. ........... 428/457 |
| 4,885,211 A | 12/1989 | Tang et al. .................. 428/457 |
| 5,130,603 A | 7/1992 | Tokailin et al. .............. 313/504 |
| 5,151,629 A | 9/1992 | VanSlyke .................... 313/504 |
| 5,227,252 A | 7/1993 | Murayama et al. ......... 428/690 |
| 5,247,190 A | 9/1993 | Friend et al. .................. 257/40 |
| 5,317,169 A | 5/1994 | Nakano et al. ................ 257/40 |
| 5,382,477 A | 1/1995 | Saito et al. .................. 428/690 |
| 5,409,783 A | 4/1995 | Tang et al. .................. 428/690 |
| 5,514,878 A | 5/1996 | Holmes et al. ................ 257/40 |
| 5,672,678 A | 9/1997 | Holmes et al. .............. 528/373 |
| 5,726,457 A | 3/1998 | Nakano et al. ................ 257/40 |
| 5,955,834 A | 9/1999 | Epstein et al. .............. 313/501 |
| 6,004,681 A | 12/1999 | Epstein et al. .............. 428/457 |
| 6,093,864 A | 7/2000 | Tokailin et al. ................ 585/25 |
| 2003/0189190 A1 * | 10/2003 | Miyano et al. ........ 252/301.16 |

FOREIGN PATENT DOCUMENTS

| JP | 2-247278 | 10/1990 |
| JP | 3-255190 | 11/1991 |
| JP | 4-145192 | 5/1992 |
| JP | 5-170707 | 7/1993 |
| JP | 5-202356 | 8/1993 |
| JP | 5-247460 | 9/1993 |
| JP | 6-33049 | 2/1994 |
| JP | 9-169772 | 6/1997 |
| JP | 9-202878 | 8/1997 |
| JP | 9-227576 | 9/1997 |
| WO | 98/05494 | 2/1998 |
| WO | 98/05693 | 2/1998 |
| WO | 98/06122 | 2/1998 |
| WO | 98/26287 | 6/1998 |
| WO | 01/66667 | 9/2001 |

OTHER PUBLICATIONS

Huriye Akdas, et al., "Thiacalixarenes: Synthesis and Structural Analysis of Thiacalix[4]arene and of p-tert-Butylthiacalix[4]arene", Tetrahedron Letters, vol. 39, pp. 2311-2314 (1998).
Giovanni Casiraghi, et al., "Selective Step-Growth Phenol-Aldehyde Polymerization, 1 Synthesis, Characterization and X-Ray Analysis of Linear All-Ortho Oligonuclear Phenolic Compounds", Makromol. Chem., vol. 183, pp. 2611-2633 (1982).
C. David Gutsche, et al., "Synthesis of a Functionalizable Calix[4]arene in a Conformationally Rigid Cone Conformation", J. Am. Chem. Soc., vol. 104, pp. 2652-2653 (1982).
J.H. Burroughes, et al., "Light-Emitting Diodes Based on Conjugated Polymers", Nature, vol. 347, pp. 539-541 (1990).
C.W. Tang, et al., "Organic Electroluminescent Diodes", Appl. Phys. Lett., vol. 51, No. 12, pp. 913-915 (Sep. 1987).
Patent Abstracts of Japan, vol. 018, No. 251 (C-1199), May 13, 1994 (corresponds to JP 6-33049).
Patent Abstracts of Japan, vol. 017, No. 582 (C-1123), Oct. 22, 1993 (corresponds to JP 5-170707).
Patent Abstracts of Japan, vol. 1997, No. 10, Oct. 31, 1997 (corresponds to JP 9-169772).

\* cited by examiner

*Primary Examiner*—Marie Yamnitzky
(74) *Attorney, Agent, or Firm*—Fitzpatrick, Cella, Harper & Scinto

(57) ABSTRACT

In an organic luminescence device formed of one or plural layers of organic films between an anode and a cathode, at least one layer is any one of a luminescence layer, an electron injection layer and an electron-transporting layer and is formed of at least a phenolic derivative of any one of formulas (1-a), (1-b), (2-a) and (2-b) characterized by having at least two phenoxide portions connected to each other via a specific divalent bond in its molecular structure. By the use of the phenolic derivative, the resultant organic luminescence device produces a high-luminance fluorescent luminescence at a low voltage for a long period of time.

5 Claims, 2 Drawing Sheets

ORGANIC LUMINESCENCE DEVICE

This is a continuation of PCT/JP 02/09673, filed Sep. 20, 2002.

TECHNICAL FIELD

The present invention relates to an organic (electro-) luminescence device including a layer of a specific phenolic derivative capable of directly converting electric field energy into light energy under application of electric field.

BACKGROUND ART

An organic luminescence device generally comprises a pair of electrodes (comprising an anode and a cathode) and a film comprising a fluorescent organic compound disposed between the electrodes. Into the organic compound layer (film), holes and electrons are injected from the anode and the cathode, respectively, thus forming excitons of the fluorescent organic compound. When the excitons are returned to ground state, the organic luminescence device emits light or causes luminescence.

According to a study by Eastman Kodak Co. ("Appl. Phys. Lett.", vol. 51, pp. 913-(1987)), it has been reported that a function-separation type organic luminescence layer comprising mutually laminated two layers including a layer of an aluminum quinolinol complex (as an electron transporting and luminescent material) and a layer of a triphenylamine derivative (as a hole transporting material) causes luminescence at a luminance (brightness) of ca. 1,000 cd/m² under application of a voltage of ca. 10 volts. This is also reported in, e.g., U.S. Pat. Nos. 4,539,507; 4,720,432 and 4,885,211.

Further, by changing species of the fluorescent organic compound, it is possible to effect luminescence over broad wavelength regions ranging from an ultraviolet region to an infrared region. In this regard, various compounds have been extensively studied in recent years. Such compounds have been proposed in, e.g., U.S. Pat. Nos. 5,151,629, 5,409,783 and 5,382,477, and Japanese Laid-Open Patent Applications (JP-A) 2-247278 (corr. to U.S. Pat. Nos. 5,130,603 and 6,093,864), JP-A 3-255190 (corr. to U.S. Pat. No. 5,227,252), JP-A 5-202356, JP-A 9-202878 and JP-A 9-227576.

In addition to the above-mentioned organic luminescence devices using low-molecular weight materials, an organic luminescence device using a conjugated polymer has been reported by a research group of Cambridge University ("Nature", vol. 347, pp. 539-(1990)). According to this report, a signal layer of polyphenylenevinylene (PPV) is formed through a wet-coating process and luminescence from the single layer is confirmed. Such an organic luminescence device using a conjugated polymer has also been proposed by, e.g., U.S. Pat. Nos. 5,247,190, 5,514,878 and 5,672,678, JP-A 4-145192 (corr. to U.S. Pat. Nos. 5,317,169 and 5,726,457), and JP-A 5-247460.

As described above, recent progress in organic luminescence device is noticeable, and the resultant organic luminescence devices are characterized by high luminance (brightness) under application of a low voltage, various (light-)emission wavelengths, high-speed responsiveness, small thickness and light weight, thus suggesting possibility of wide applications.

However, the above-described organic luminescence devices are still required to effect light output (emission) at a higher luminance and/or a higher conversion efficiency in the present state. These organic luminescence devices are also still insufficient in terms of durability such that the devices are liable to be changed in their properties with time when used for a long period or liable to be deteriorated by the influence of ambient air containing oxygen or of humidity. Further, in the case of using the organic luminescence devices for full-color display, it is necessary to effect luminescences of blue, green and red with good color purities. However, a satisfactory solution to the problem has not been realized yet.

DISCLOSURE OR INVENTION

A generic object of the present invention is to provide improvements to problems as mentioned above encountered in organic luminescence devices proposed heretofore.

A more specific object of the present invention is to provide an organic (electro-) luminescence device capable of effecting light output (emission) at high efficiency and luminance while realizing a prolonged life.

Another object of the present invention is to provide an organic luminescence device capable of providing a wide variety of emission wavelengths and emission hues, and a good durability.

A further object of the present invention is to provide an organic luminescence device which can be produced easily and relatively inexpensively.

According to the present invention, there is provided an organic luminescence device, comprising:
a pair of an anode and a cathode, and
at least one organic layer disposed between the anode and the cathode, wherein
said at least one organic layer comprises a layer comprising at least one species of a phenolic derivative represented by the following formula (1-a) or (1-b):

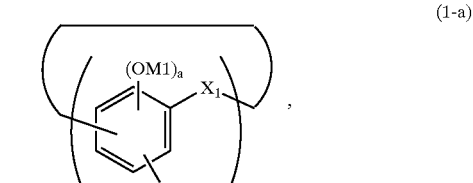

(1-a)

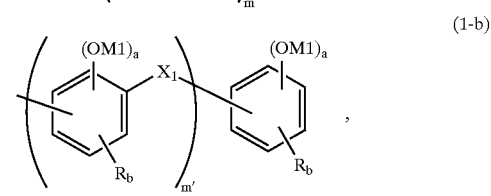

(1-b)

wherein

R denotes a substituent selected from the group consisting of a hydrogen atom, a halogen atom, a nitro group, a nitrile group, a substituted silyl group, a substituted or unsubstituted alkyl group, an substituted or unsubstituted alkenyl group, a substituted or unsubstituted aralkyl group, a substituted or unsubstituted aryl group, a substituted or unsubstituted amino group, a substituted or unsubstituted azomethine group, a substituted or unsubstituted carbonyl group, a substituted or unsubstituted alkoxy group, a substituted or unsubstituted ether group, and a substituted or unsubstituted heterocyclic group;

M1 denotes an alkali metal;

m is an integer of 2–100;

m' is an integer of 1–100;

a is an integer of 1–4; and b is an integer of 0–3, with the proviso that $1 \leq a+b \leq 4$; and X1 denotes a divalent group selected from the group consisting of a single bond, an alkylene group having 1–10 carbon atoms, -(alkylene)-(substituted or unsubstituted nitrogen)-, -(alkylene)-O—, -(alkylene)-S—, a substituted or unsubstituted nitrogen, —O—, —S—, —SO—, —SO$_2$—, a polysulfide having 2–10 sulfur atoms, a polysulfoxide having 2–10 sulfur atoms, a polysulfone having 2–10 sulfur atoms, —CO— and —COO—.

According to the present invention, there is also provided an organic luminescence device, comprising:

a pair of an anode and a cathode, and at least one organic layer disposed between the anode and the cathode, wherein said at least one organic layer comprises a layer comprising at least one species of a phenolic derivative represented by the following formula (2-a) or (2-b):

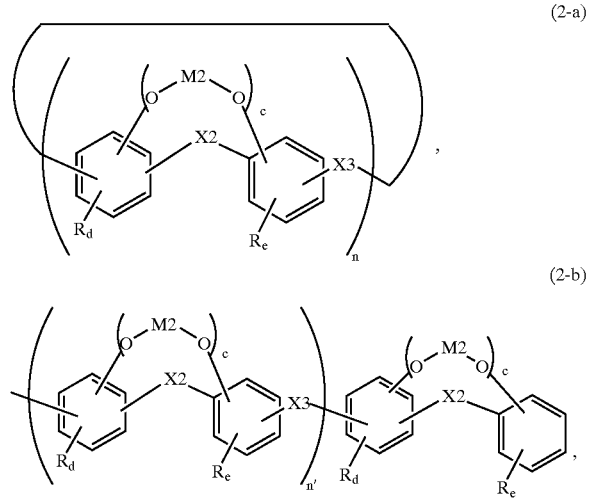

(2-a)

(2-b)

wherein

R denotes a substituent selected from the group consisting of a hydrogen atom, a halogen atom, a nitro group, a nitrile group, a substituted silyl group, a substituted or unsubstituted alkyl group, an substituted or unsubstituted alkenyl group, a substituted or unsubstituted aralkyl group, a substituted or unsubstituted aryl group, a substituted or unsubstituted amino group, a substituted or unsubstituted azomethine group, a substituted or unsubstituted carbonyl group, a substituted or unsubstituted alkoxy group, a substituted or unsubstituted ether group, and a substituted or unsubstituted heterocyclic group;

M2 denotes an alkali earth metal;

n is an integer of 1–50;

n' is an integer of 0–50;

c is an integer of 1 or 2; and d and e are an integer of 0–3, with the proviso that $1 \leq c+d \leq 4$ and $1 \leq c+e \leq 4$;

X2 denotes a divalent group selected from the group consisting of a single bond, an alkylene group having 1–10 carbon atoms, -(alkylene)-(nitrogen)-, -(alkylene)-O—, -(alkylene)-S—, a substituted or unsubstituted nitrogen, —O—, —S—, —SO—, —SO$_2$—, —CO— and —COO—; and X3 denotes a divalent group selected from the group consisting of a single bond, an alkylene group having 1–10 carbon atoms, -(alkylene)-(substituted or unsubstituted nitrogen)-, -(alkylene)-O—, -(alkylene)-S—, a substituted or unsubstituted nitrogen, —O—, —S—, —SO—, —SO$_2$—, a polysulfide having 2–10 sulfur atoms, a polysulfoxide having 2–10 sulfur atoms, a polysulfone having 2–10 sulfur atoms, —CO— and —COO—.

According to the present invention, there is further provided an apparatus, comprising: the above-mentioned organic luminescence device and means for applying an electric field to the organic luminescence device.

These and other objects, features and advantages of the present invention will become more apparent upon a consideration of the following description of the preferred embodiments of the present invention taken in conjunction with the accompanying drawings.

BEST MODE FOR PRACTICING THE INVENTION

Figure 1:
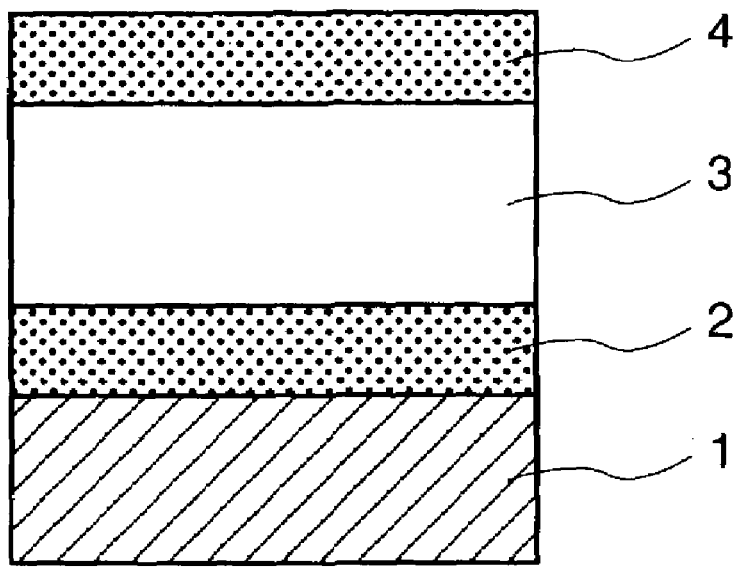
FIGS. 1 to 3 are schematic sectional views each illustrating a basic structure of an organic luminescence device according to an embodiment of the present invention.

The organic luminescence device according to the present invention is characterized in that at least one organic (compound) layer disposed between the pair of electrodes (anode and cathode) includes a layer comprising at least one species of a phenolic derivative represented by any one of the above-mentioned formulas (1-a), (1-b), (2-a) and (2-b).

The phenolic derivative used in the present invention may include a phenolic derivative having a cyclic structure as represented by the formula (1-a) or the formula (2-a) and a phenolic derivative having a chain structure as represented by the formula (1-b) or the formula (2-b).

In each of the formulas (1-a), (1-b), (2-a) and (2-b), as described above, R represents a substituent selected from the group consisting of a hydrogen atom, a halogen atom, a nitro group, a nitrile group, a substituted silyl group, a substituted or unsubstituted alkyl group, an substituted or unsubstituted alkenyl group, a substituted or unsubstituted aralkyl group, a substituted or unsubstituted aryl group, a substituted or unsubstituted amino group, a substituted or unsubstituted azomethine group, a substituted or unsubstituted carbonyl group, a substituted or unsubstituted alkoxy group, a substituted or unsubstituted ether group, and a substituted or unsubstituted heterocyclic group.

Examples of the substituted silyl group may include dimethylsilyl, trimethylsilyl, triethylsilyl, triphenylsilyl, tertiary(t-)butyldimethylsilyl, and t-butyldiphenylsilyl.

Examples of the alkyl group may include methyl, ethyl, n-propyl, iso-propyl, t-butyl and octyl.

Examples of the alkenyl group may include vinyl, allyl (or 2-propenyl), 1-propenyl, iso-propenyl and 2-butenyl.

Examples of the aralkyl group may include benzyl and phenethyl.

Examples of the alkoxy group may include methoxy, ethoxy, propoxy, 2-ethyl-octyloxy, phenoxy, 4-butylphenoxy and benzyloxy.

Examples of the aryl group may include phenyl, 4-lithiumoxyphenyl, 4-potassiumoxyphenyl, 4-cesiumoxyphenyl, 4-methylphenyl, 4-ethylphenyl, 3-chlorophenyl, 3,5-dimethylphenyl, N,N'-diphenylaminophenyl, biphenyl, terphenyl, naphthyl, anthryl, phenanthryl, pyrenyl, and ferrocenyl.

Examples of the amino group may include amino, methylamino, ethylamino, dimethylamino, diethylamino, methylethylamino, benzylamino, methylbenzylamino, anilino, diphenylamino, phenyltolylamino, and ditolylamino.

Examples of the azomethine group may include methylimino, ethylimino, phenylimino, (4-dimethylaminophenyl)imino, (4-cyanophenyl)imino, (4-fluorophenyl)imino, 2-pyridylimino, 9-anthrylimino, and 1-pyrenylimino.

Examples of the carbonyl group may include acetyl, propionyl, isobutyryl, methacryloyl, benzoyl, naphthoyl, anthrolyl and toluoyl.

Examples of the ether group may include methoxymethyl, methoxydimethylmethyl, methoxyethyl, ethoxymethyl, and phenoxymethyl.

Examples of the heterocyclic group may include pyridyl, bipyridyl, methylpyridyl, thienyl, terthienyl, propylthienyl, furyl, quinolyl, carbazolyl and N-ethylcarbazolyl.

Examples of the optional substituents which may be possessed by the above-mentioned groups for R may include: alkyl group, such as methyl, ethyl, n-propyl, iso-propyl, t-butyl, and octyl; aralkyl group, such as benzyl and phenethyl; alkoxy group, such as methoxy, ethoxy, propoxy, 2-ethyl-octyloxy, phenoxy, 4-butylphenoxy and benzyloxy; aryl group, such as phenyl, 4-methylphenyl, 4-ethylphenyl, 3-chlorophenyl, 3,5-dimethylphenyl, N,N'-diphenyl-aminophenyl, biphenyl, terphenyl, naphthyl, anthryl, phenanthryl and pyrenyl; and heterocyclic group, such as pyridyl, bipyridyl, methylpyridyl, thienyl, terthienyl, propylthienyl, furyl, quinolyl, carbazolyl, and N-ethylcarbazolyl.

In the formulas (1-a) and (1-b), examples of the alkali metal (M1) may include metals in Group 1 of the periodic table, such as lithium (Li), sodium (Na), potassium (K), rubidium (Rb), cesium (Cs) and francium (Fr). Among these metals, Li, K and Cs are preferred.

In the formulas (2-a) and (2-b), examples pf the alkali earth metal (M2) may include metals in Group 2 of the periodic table, such as beryllium (Be), magnesium (Mg), calcium (Ca), strontium (Sr), barium (Ba) and radium (Ra). Among these metals, Be, Mg and Ca are preferred.

In the formula (1-a), m may preferably be an integer of 2–10.

In the formula (1-b), m' may preferably be an integer of 1–10.

In the formula (2-a), n may preferably be an integer of 1–5.

In the formula (2-b), n' may preferably be an integer of 0–5.

Examples of the optional substituents which may be possessed by the substituted nitrogen-(containing) group for X1, X2 and X3 may include: alkyl group, such as methyl, ethyl, n-propyl, iso-propyl, t-butyl, and octyl; aralkyl group, such as benzyl and phenethyl; aryl group, such as phenyl, 4-methylphenyl, 4-ethylphenyl, 3-chlorophenyl, 3,5-dimethylphenyl, N,N'-diphenylaminophenyl, biphenyl, terphenyl, naphthyl, anthryl, phenanthryl and pyrenyl; and heterocyclic group, such as pyridyl, bipyridyl, methylpyridyl, thienyl, terthienyl, propylthienyl, furyl, quinolyl, carbazolyl, and N-ethylcarbazolyl.

Specific examples of the phenolic derivatives of the formulas (1-a), (2-a), (1-b) and (2-b) described above may include those (Example Compound Nos. 1–138) shown below, wherein Me represents methyl, tBu represents t-butyl, and Ph represents phenyl.

Incidentally, the phenolic derivatives used in the present invention inclusive of those enumerated below are synthesized by, e.g., methods as reported by Ber. Dtsch. Chem. Ges. 72B, 264 (1944); Kagaku 34, 832 (1979); J. Am. Chem. Soc. 104, 2652 (1982); Tetrahedron Letters 39, 2311 (1998); Makromol. Chem. 183, 2611 (1982); Prom. Khim. Reaktivov Osobo Chist. Veshchest 10, 20 (1967); and Bulletin of the Korean Chemical Society 18, 636 (1997).

Formula (1-a)

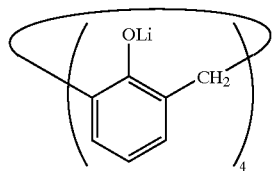

1

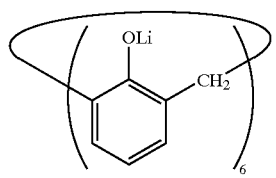

2

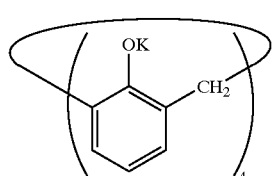

3

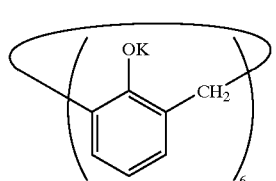

4

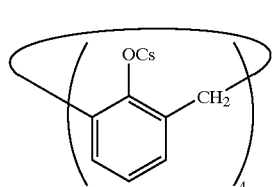

5

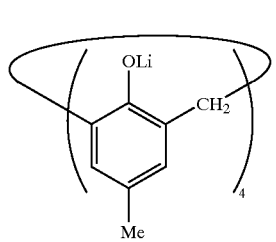

6

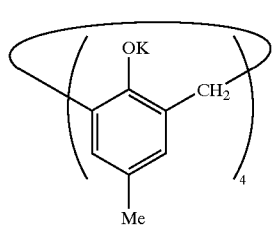

7

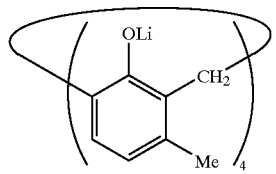

8

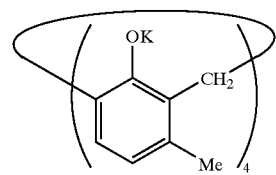
9
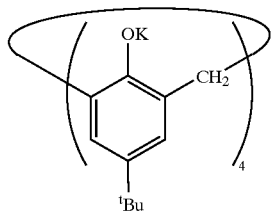
10
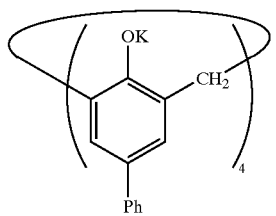
11
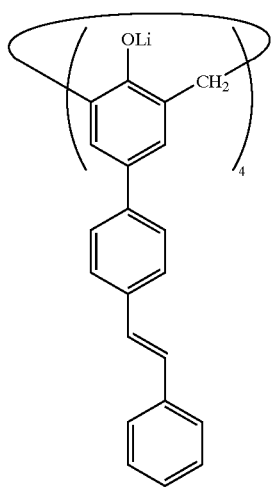
12
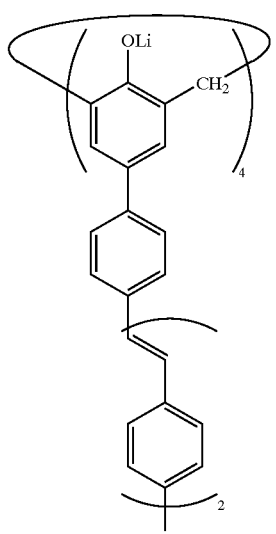
13
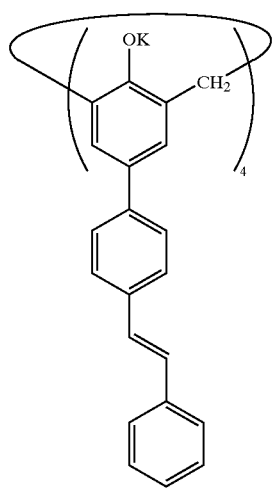
14
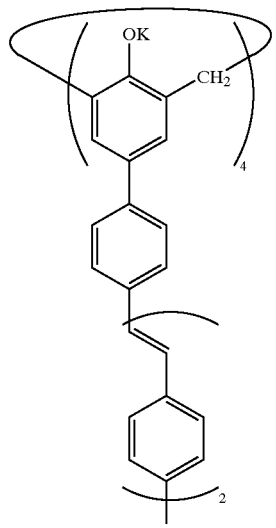
15
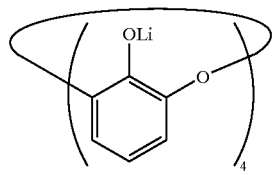
16
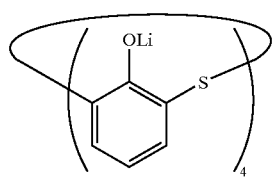
17
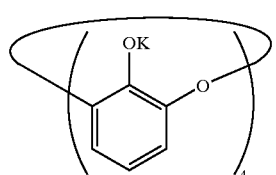
18

-continued
19 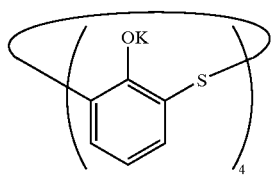
20 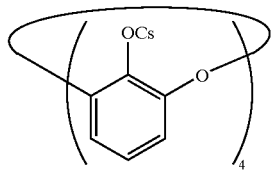
21 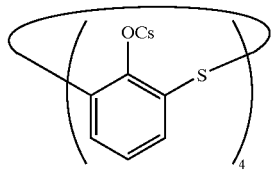
22 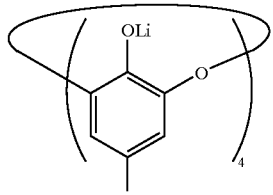
23 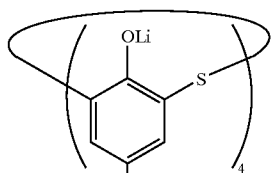
24 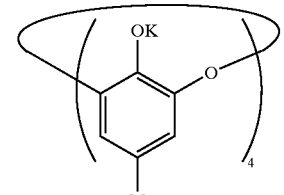
25 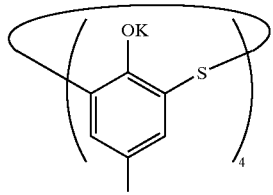
-continued
26 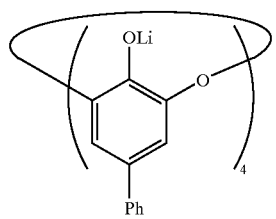
27 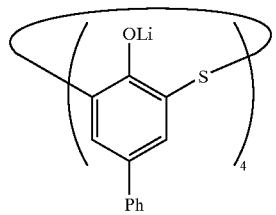
28 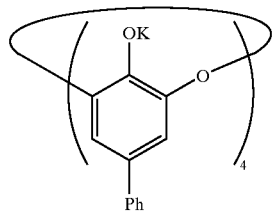
29 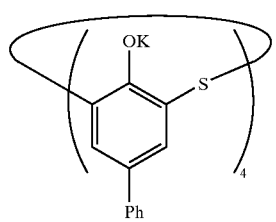
30 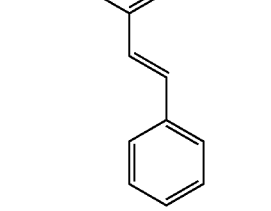

31
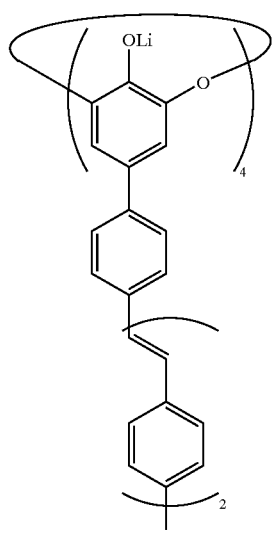
32
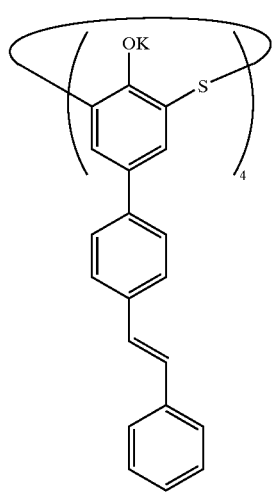
33
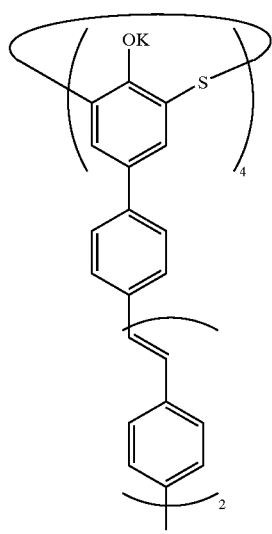
34
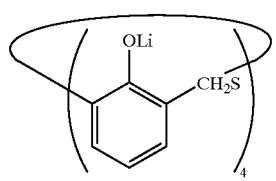
35
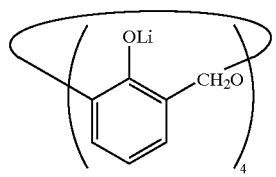
36
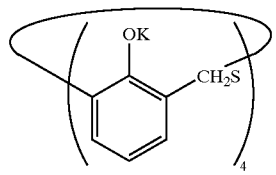
37
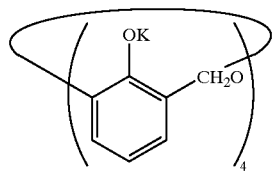
38
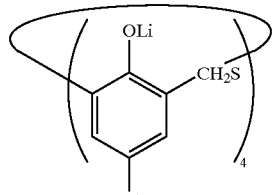
39
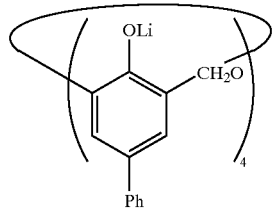
40
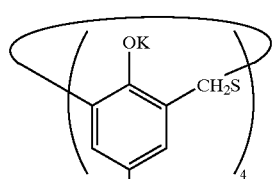
41
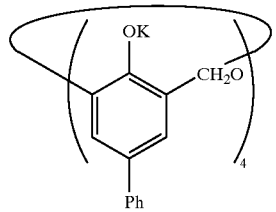

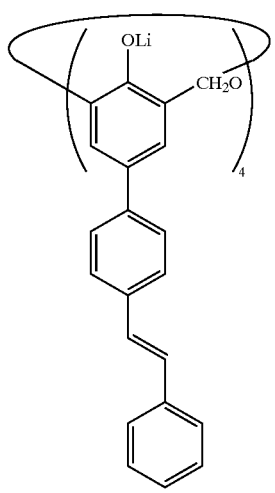
42
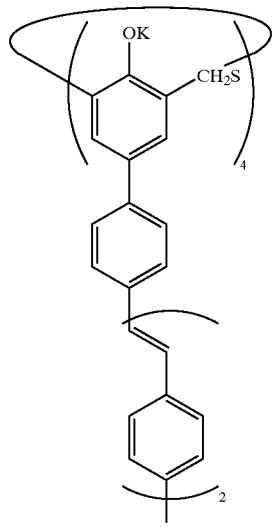
45
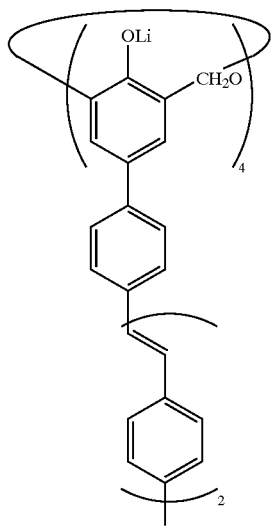
43
Formula (2-a)
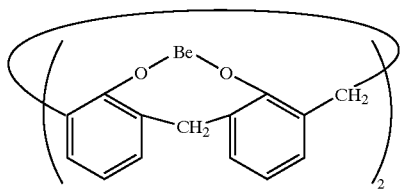
46
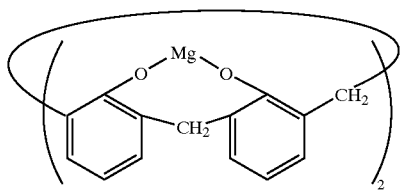
47
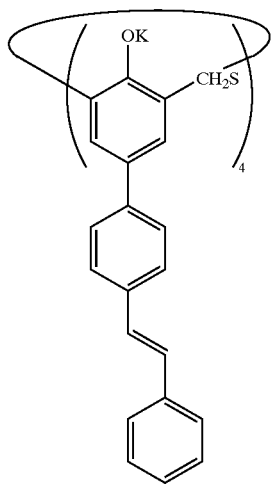
44
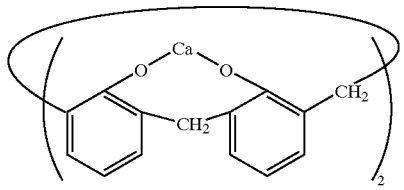
48
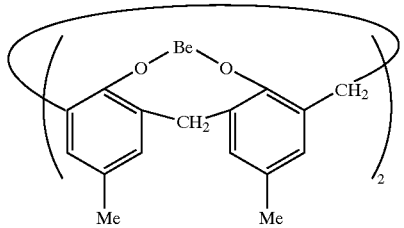
49

50
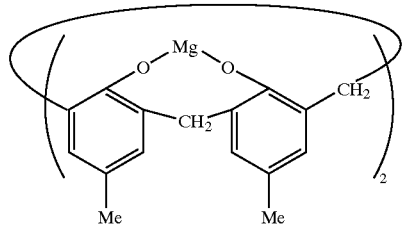
51
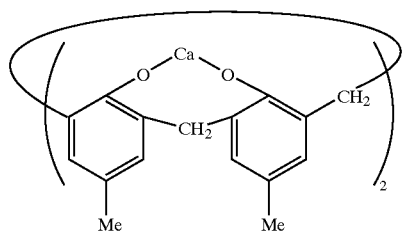
52
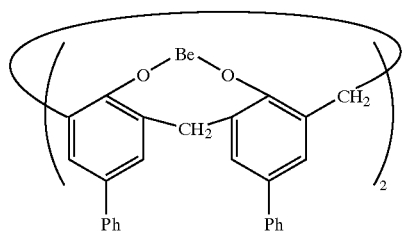
53
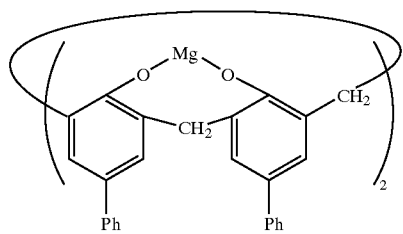
54
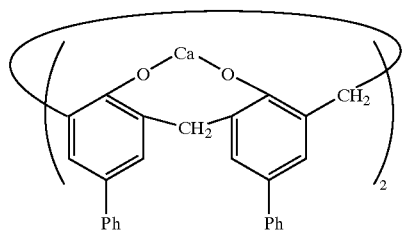
55
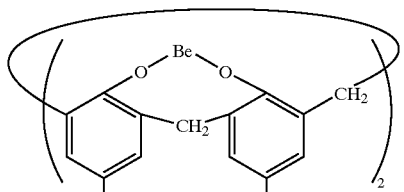
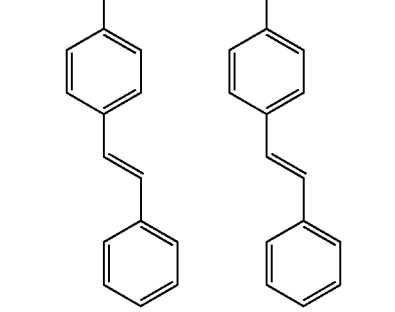
56
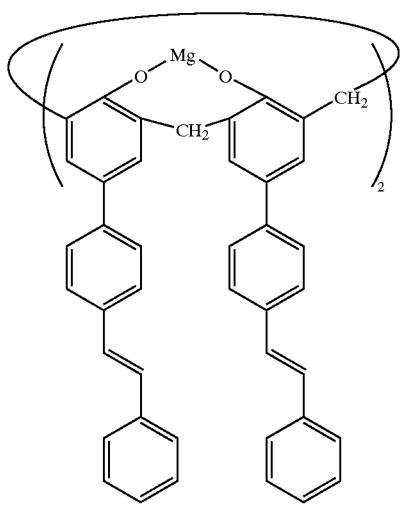
57
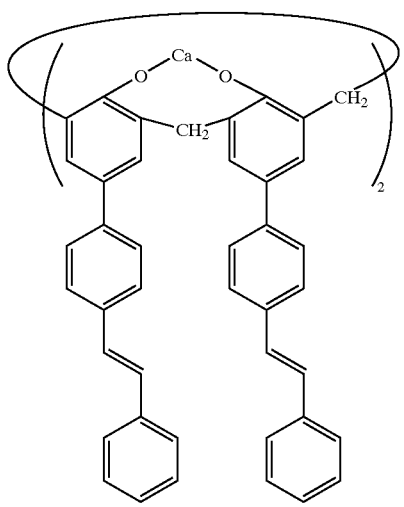

-continued
58
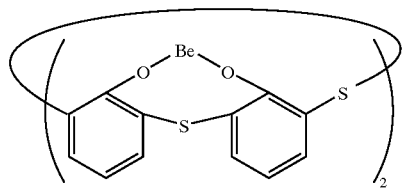
59
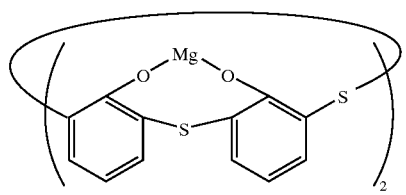
60
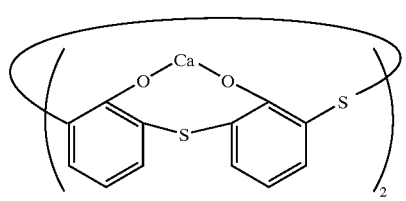
61
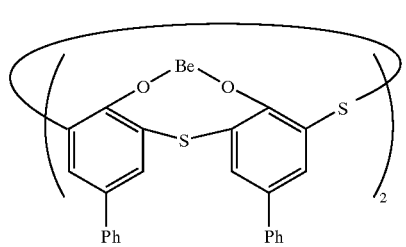
62
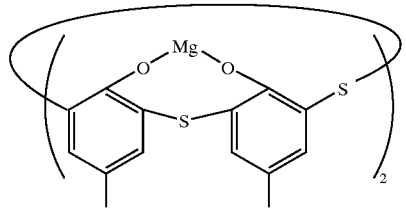
63
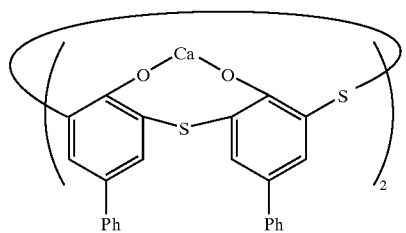
-continued
64
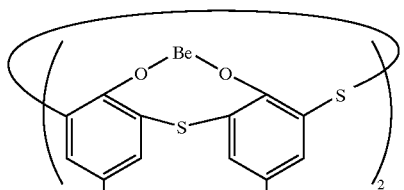
65
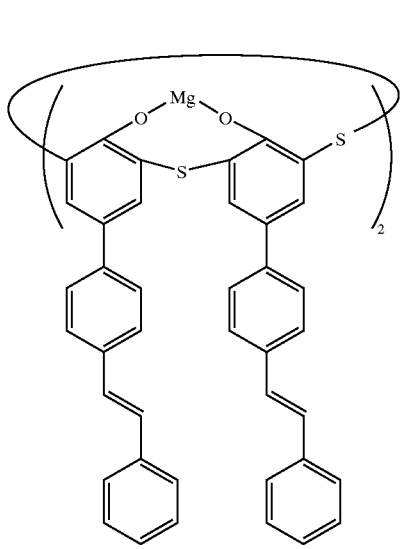
66
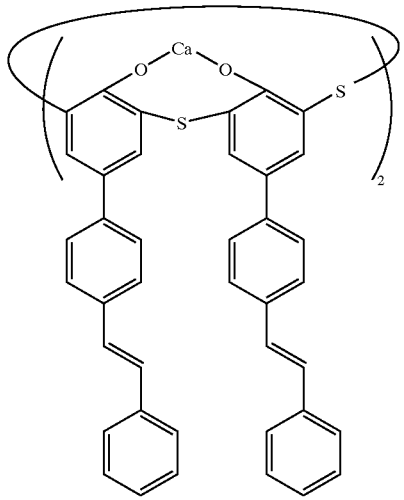

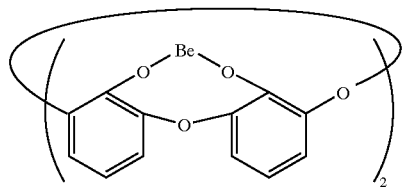
67
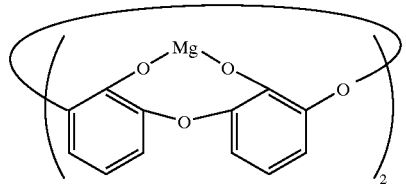
68
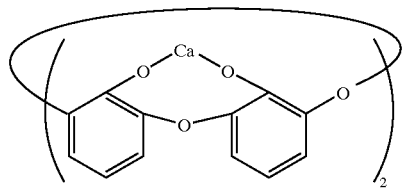
69
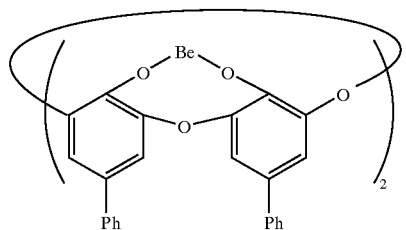
70
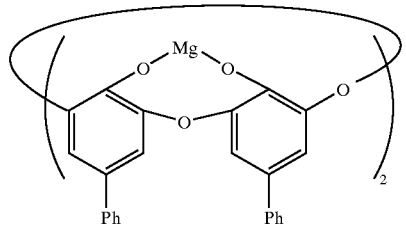
71
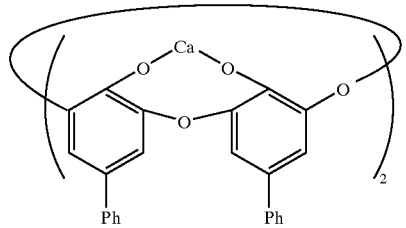
72
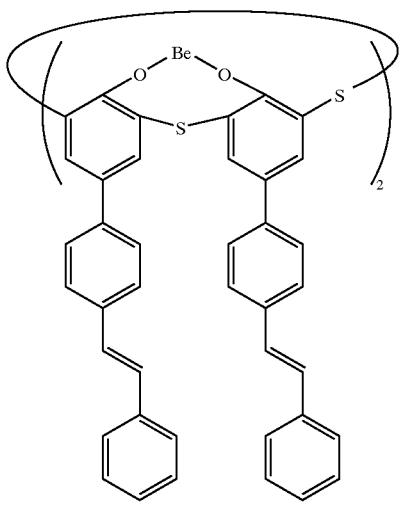
73
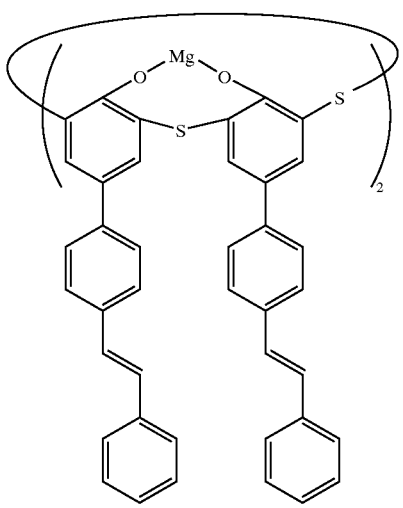
74
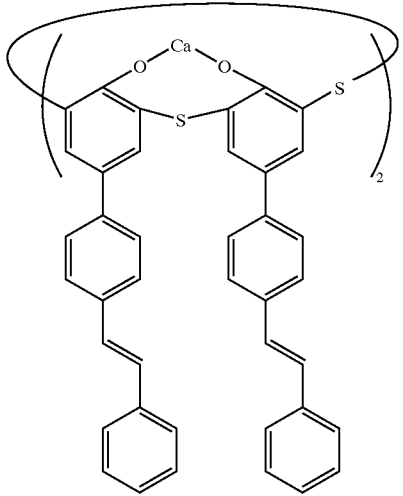
75

-continued
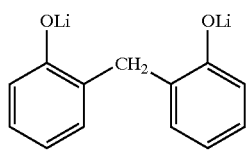
76
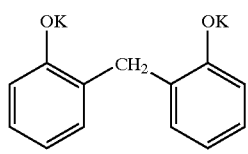
77
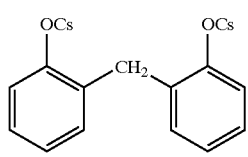
78
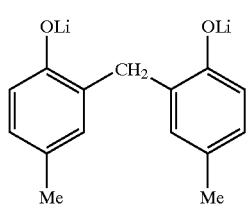
79
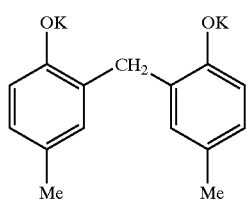
80
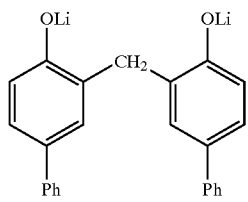
81
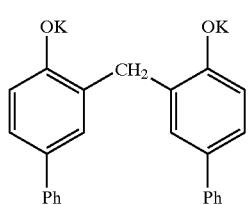
82
-continued
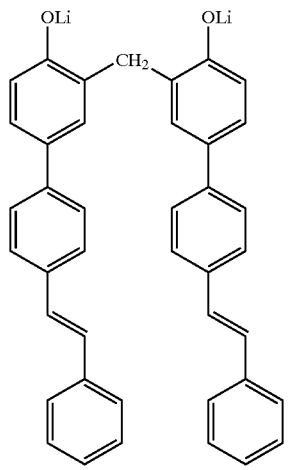
83
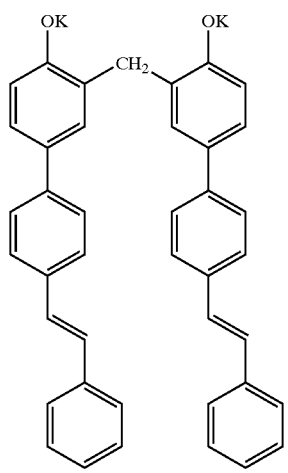
84
Formula (1-b)
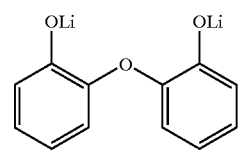
85
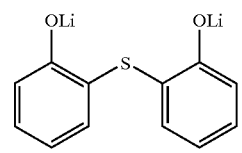
86
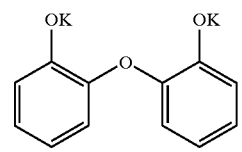
87

88 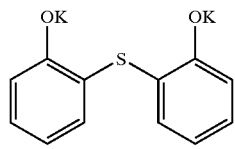
89 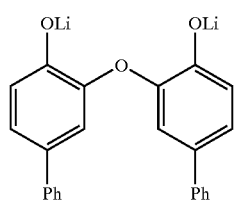
90 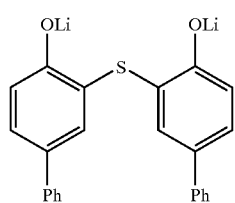
91 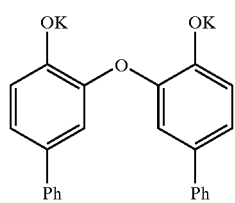
92 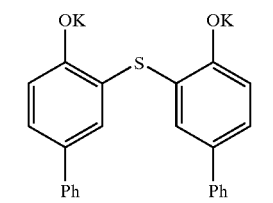
93 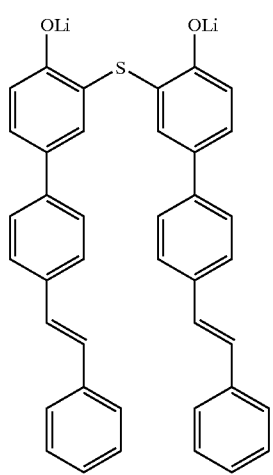
94 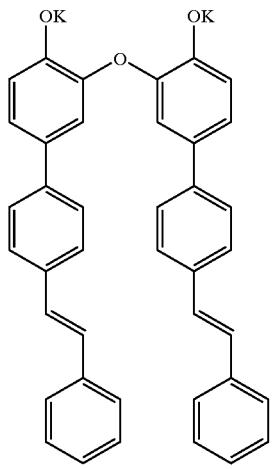
95 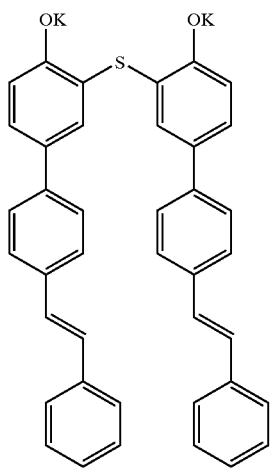
96 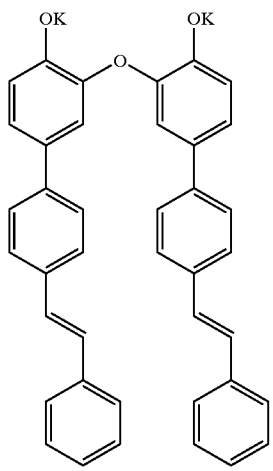
97 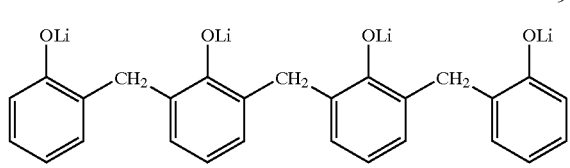

98
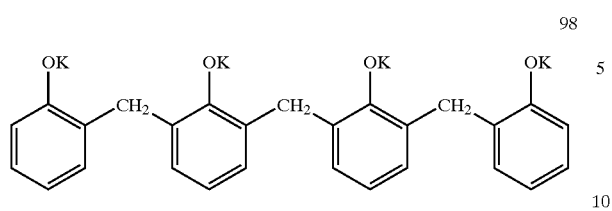
99
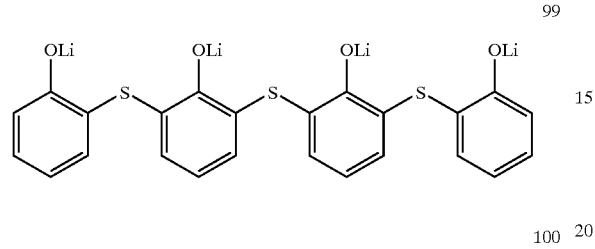
100
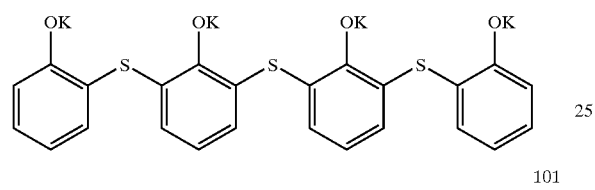
101
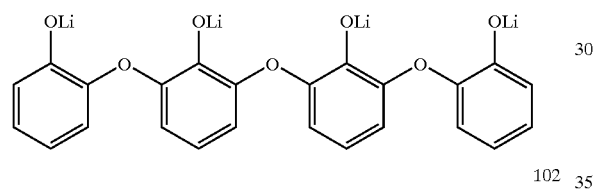
102
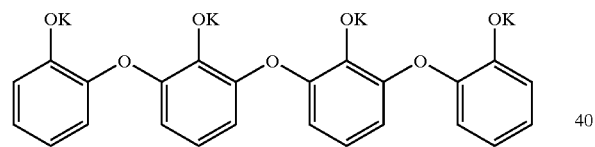
Formula (2-b)
103
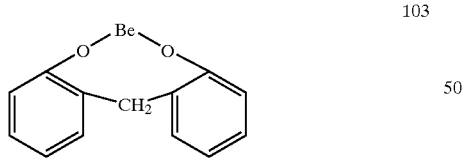
104
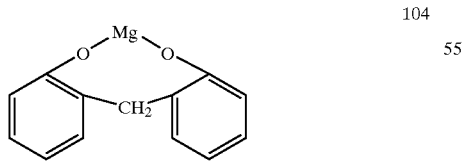
105
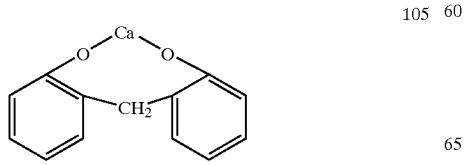
106
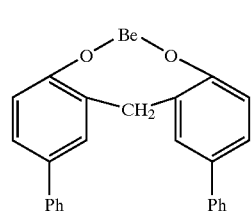
107
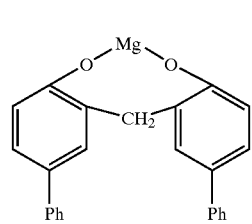
108
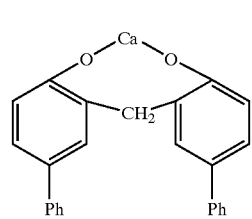
109
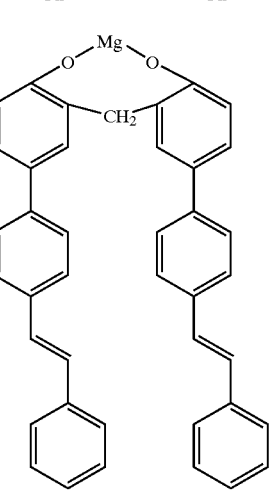
110
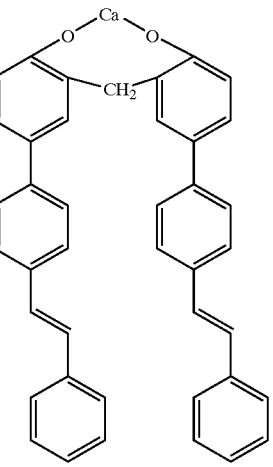

111 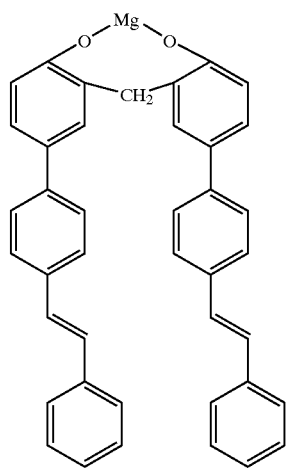
112 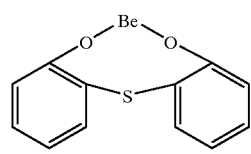
113 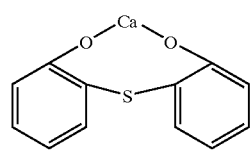
114 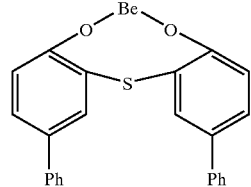
115 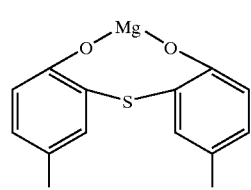
116 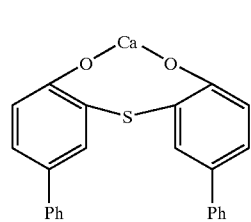
118 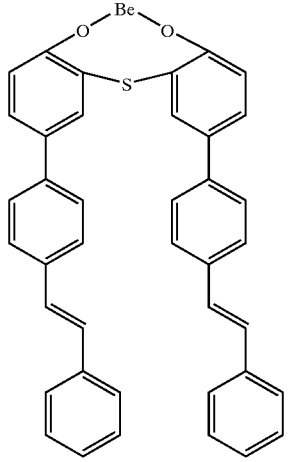
119 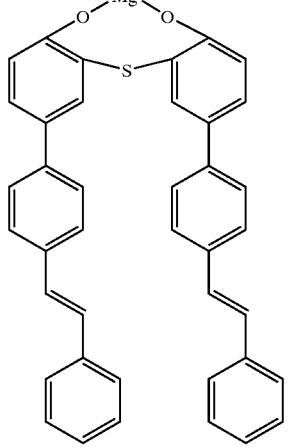
120 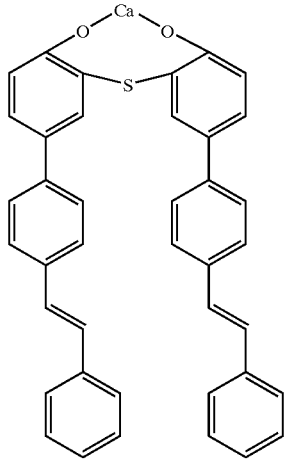
121 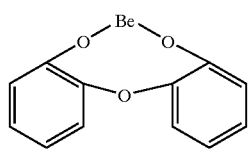

122 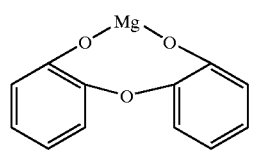
123 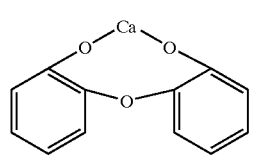
124 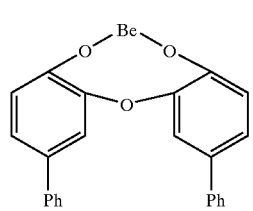
125 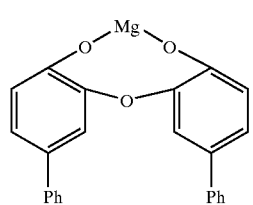
126 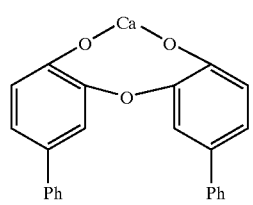
127 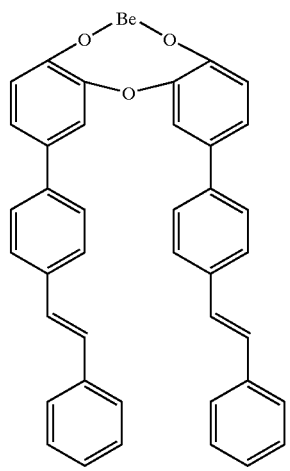
128 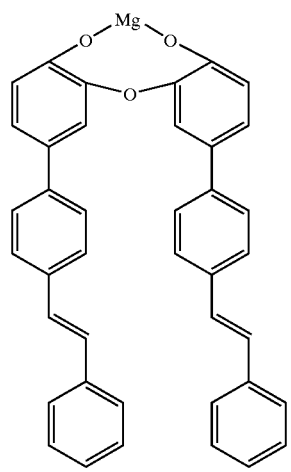
129 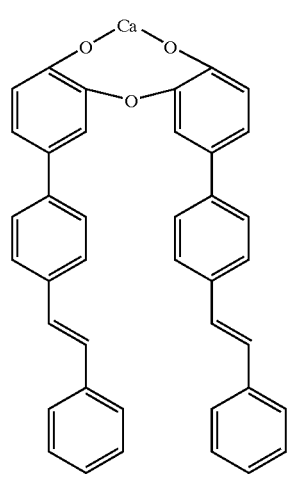
130 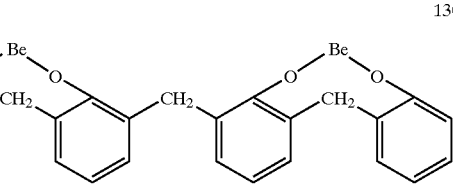
131 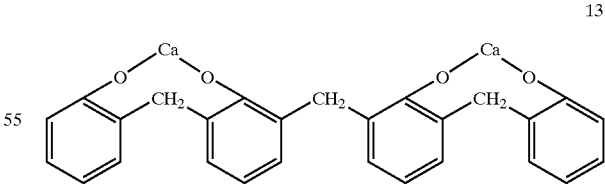
132 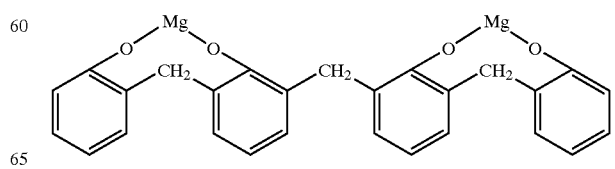

-continued

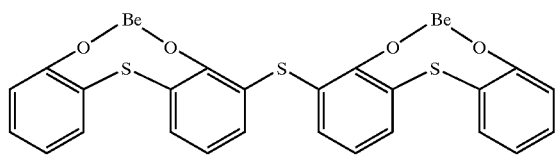

133

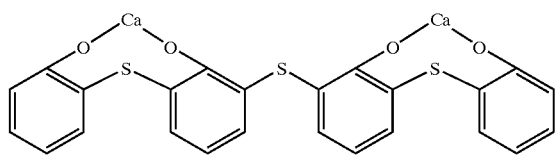

134

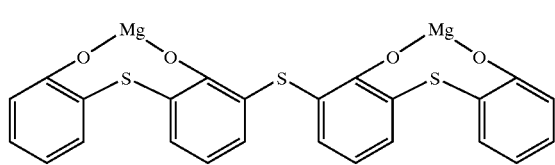

135

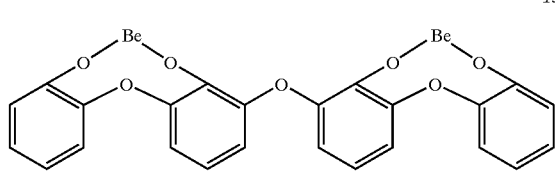

136

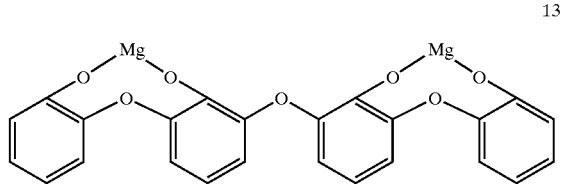

137

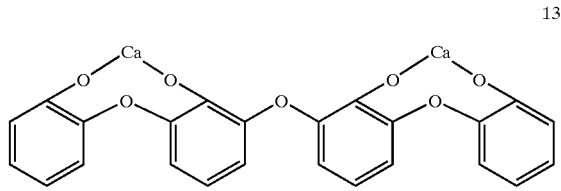

138

Synthesis Example 1 (Ex. Comp. No. 1)

In a nitrogen atmosphere, 600 mg (1.41 mM) of calix[4]arone was dissolved in 150 ml of ethanol, followed by stirring under heating on an oil bath heated at 80° C. To the solution, a solution of 135 mg (5.64 mM) of lithium hydroxide in 30 ml of ethanol was gradually added dropwise. The reaction solution was changed from a white (turbid) solution to a transparent solution, followed by stirring under heating or 4 hours. After standing to cool, the solvent was distilled off to obtain a white solid. The white solid was dried and aerated with nitrogen to obtain 570 mg of an objective phenolic derivative (Ex. Comp. No. 1).

Synthesis Example 2 (Ex. Comp. No. 3)

In a nitrogen atmosphere, 600 mg (1.41 mM) of calix[4]arone was dissolved in 150 ml of ethanol, followed by stirring under heating on an oil bath heated at 80° C. To the solution, a solution of 316 mg (5.64 mM) of lithium potassium in 30 ml of ethanol was gradually added dropwise. The reaction solution was changed from a white (turbid) solution to a transparent solution, followed by stirring under heating or 2 hours. After standing to cool, the solvent was distilled off to obtain a white solid. The white solid was dried and aerated with nitrogen to obtain 747 mg of an objective phenolic derivative (Ex. Comp. No. 3).

Synthesis Example 3

A phenolic derivative (Ex. Comp. No. A) shown below was synthesized.

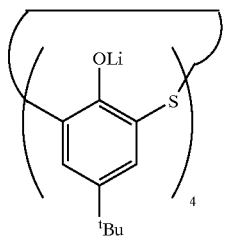

A

In a nitrogen atmosphere, 5 g (33.3 mM) of 4-t-butylphenol, 2.13 g (6.66 mM) of sulfur (S8) and 670 mg (16.7 mM) of sodium hydroxide were dissolved in 10 ml of tetraethylene glycol dimethyl ether followed by stirring at room temperature. The reaction solution was gradually heated on an oil bath and stirred on the oil bath for 6 hours at 200° C. After standing to cool, the reaction solution was diluted with the addition of toluene and diethyl ether, followed by addition of 0.5M-sulfuric acid aqueous solution to precipitate a solid. The precipitated solid and a solid obtained after distilling-off of the solvent were together purified by silica gel column chromatography (eluent: hexane/chloroform=2/3) to obtain 3 g of 4-t-butylthiacalix[4]arene.

In a nitrogen atmosphere, 1.02 g (1.41 mM) of 4-t-butylthiacalix[4]arene was dissolved in 150 ml of ethanol and stirred on an oil bath heated at 80° C.

To the solution, a solution of 135 mg (5.64 mM) of lithium hydroxide in 30 ml of ethanol was gradually added dropwise. The reaction solution was changed from a white (turbid) solution to a transparent solution, followed by stirring under heating or 4 hours. After standing to cool, the solvent was distilled off to obtain a white solid. The white solid was vacuum-dried and aerated with nitrogen to obtain 970 mg of an objective phenolic derivative (Ex. Comp. No. A).

Synthesis Example 4 (Ex. Comp. No. 101)

In a nitrogen atmosphere, a solution of 3 g (9.93 mM) of 2,6-bis(2-hydroxybenzyl)phenol and 1.23 g (9.93 mM) of 2-hydroxybenzylalcohol in 70 ml of diethyl ether was added dropwise at room temperature to a solution of ethyl magnesium bromide prepared from 4 g (36.7 mM) of ethyl bromide, 0.9 g (37 mM) of magnesium and 100 ml of diethyl ether, followed by stirring for 1 hour. The reaction mixture was subjected to distillation off of diethyl ether, and 200 ml of toluene was added thereto, followed by stirring on an oil bath heated at 100° C. for 10 hours. After standing to cool, 10%-sulfuric acid aqueous solution was added to the resultant mixture. The organic layer was washed with saturated sodium bicarbonate aqueous solution and saturated saline water, followed by drying with anhydrous magnesium sulfate and distilling-off of the solvent. The resultant residue was purified by silica gel column chromatography (eluent: hexane/acetone=4/1) to obtain 1.22 g of 2,2'-methylenebis[6-(2-hydroxybenzyl)phenyl].

In a nitrogen atmosphere, 575 mg (1.41 mM) of 2,2'-methylenebis[6-(2-hydroxybenzyl)phenol] was dissolved in 150 ml of ethanol, followed by stirring under heating on an oil bath heated at 80° C. To the solution, a solution of 135 mg (5.64 mM) of lithium hydroxide in 30 ml of ethanol was gradually added dropwise. The reaction solution was changed from a white (turbid) solution to a transparent solution, followed by stirring under heating or 4 hours. After standing to cool, the solvent was distilled off to obtain a white solid. The white solid was vacuum-dried and aerated with nitrogen to obtain 550 mg of an objective phenolic derivative (Ex. Comp. No. 101).

In the organic luminescence device of the present invention, the organic compound layer(s) comprising at least one species of the above-mentioned phenolic derivative of the formula (1-a), (1-b), (2-a) and (2-b) may be formed between the pair of anode and cathode (electrodes) by vacuum deposition or wet-coating process. The organic compound layer(s) may preferably be formed in a (total) thickness of at most 10 μm, more preferably at most 0.5 μm, further preferably 0.01–0.5 μm.

Figure 2:
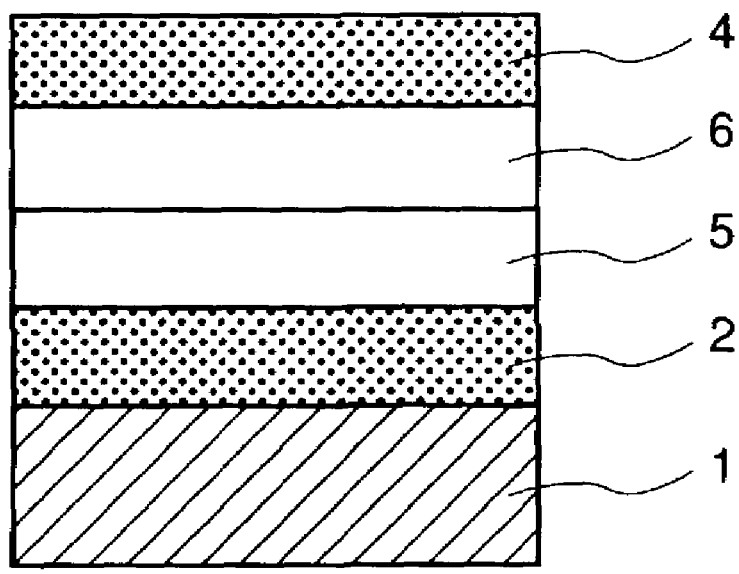
Figure 3:
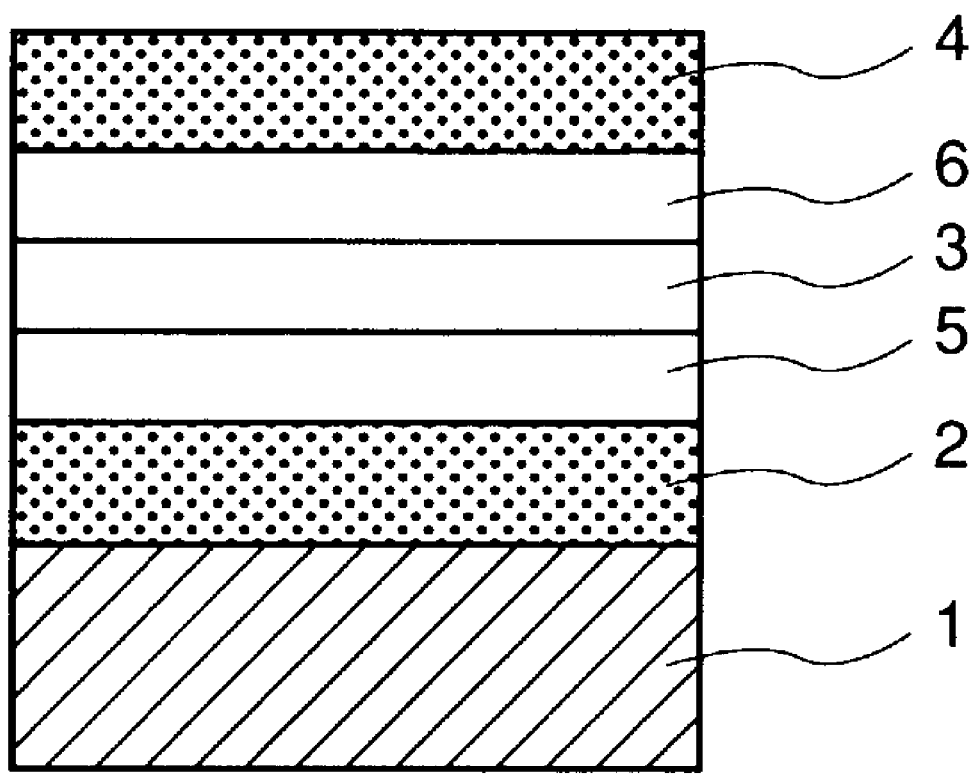

The organic compound layer(s) constituting the organic luminescence device of the present invention may have a single-layer structure as shown in FIG. 1 or a laminate structure of two or more layers as shown in FIGS. 2 and 3.

More specifically, FIG. 1 is a schematic sectional view illustrating an embodiment of the organic luminescence device of the present invention. Referring to FIG. 1, the organic luminescence device includes a substrate 1, and an anode 2, a luminescence layer 3 and a cathode 4 disposed in this order on the substrate 1 so as to form a laminate structure. The luminescence layer 3 may comprise a single species of luminescent material exhibiting a hole-transporting function, an electron-transporting function and a luminescence function in combination or a mixture of plural compounds exhibiting these functions, respectively. The luminescence layer 3 may have a thickness of 1 nm to 1 μm, preferably 5–500 nm.

FIG. 2 is a sectional view showing a laminate structure of another embodiment of the organic luminescence device. Referring to FIG. 2, the organic luminescence device includes a substrate 1, and an anode 2, a hole-transporting layer 5, an electron-transporting layer 6 and a cathode 4 disposed successively in this order on the substrate 1 so as to form a laminate structure. In this case, either one or both of the hole-transporting layer 5 and the electron-transporting layer 6 may contain a luminescent material also having a hole-transporting function and/or an electron-transporting function, respectively, for constituting a luminescence layer 3 singly or in combination. One of the layers 6 and 5 may contain a material having no luminescent function but having a good electron-transporting or hole-transporting function. Each of the hole-transporting layer 5 and the electron-transporting layer 6 may have a thickness of 1 nm to 1 μm, preferably 5–500 nm.

FIG. 3 is a sectional view showing still another embodiment of the organic luminescence device of the present invention. Referring to FIG. 3, the organic luminescence device includes a substrate 1, and an anode 2, a hole-transporting layer 5, a luminescence layer 3, an electron-transporting layer 6 and a cathode 4 disposed successively in this order on the substrate 1 to form a laminate structure. In this embodiment, the carrier transporting functions and the luminescent function of the organic compound layer are separated and assigned to the respective layers. Each of the hole-transporting layer 5, the luminescence layer 3 and the electron-transporting layer 6 may contain a single species or plural species of compounds showing respectively expected functions so as to exhibit desired performances. More specifically, in the case of using plural species of compounds in combination, a lot of latitude is provided in selection of materials for each layer, and various compounds having different emission wavelengths can be used to provide a variety of luminescence hues.

Further, as the carriers and excitons are effectively confined in the central luminescence layer 3, it is possible to increase the luminescence efficiency.

In the embodiment of FIG. 3, each of the hole-transporting layer 5, the luminescence layer 3 and the electron-transporting layer 6 may have a thickness of 1 nm-1 μm, preferably 5–500 nm.

It is to be understood however that FIGS. 1–3 described above merely show basic structures of the organic luminescence device according to the present invention, and various modifications thereof are possible. For example, between the organic compound layer(s) and the electrodes (anode and cathode), it is possible to dispose an insulating layer, an adhesive layer, or an interference layer. Further, the hole-transporting layer 5 can be divided into two layers with different ionization potentials. Further, the electron-transporting layer 6 may be formed as a single layer or a lamination layer consisting of an electron-transporting layer and an electron injection layer closer to the cathode 4.

The phenolic derivatives represented by the formulas (1-a), (1-b), (2-a) and (2-b) have better electron injection performance and electron-transporting performance than conventional compounds and can be adopted in any of the device structures shown in FIGS. 1 to 3.

The organic compound layer containing the phenolic derivative of any one of the formulas (1-a), (1-b), (2-a) and (2-b) is particularly useful as an electron injection layer and/or an electron-transporting layer and/or a luminescence layer. In this instance, the luminescence layer may directly contact the cathode 4 or contact the cathode 4 via another layer (such as the electron injection layer or the electron-transporting layer).

In the present invention, the phenolic derivative of the formula (1-a), (1-b), (2-a) or (2-b) can be used to constitute an electron injection layer, an electron-transporting layer and/or a luminescence layer, as desired, in combination with another compound, such as a known hole-transporting compound, luminescent compound or electron-transporting compound, examples of which are enumerated in Tables 1–6 hereinbelow.

TABLE 1

[Hole-transporting materials (low-molecular weight)]

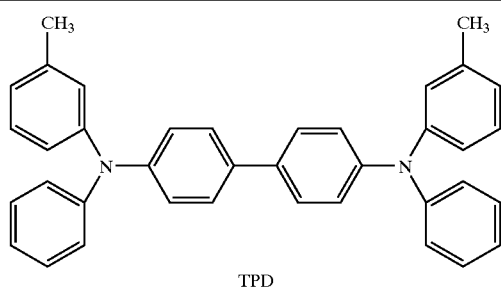

TPD

TABLE 1-continued
[Hole-transporting materials (low-molecular weight)]
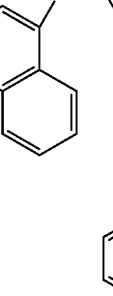
α-NPD
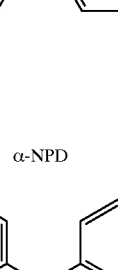
m-MTDATA
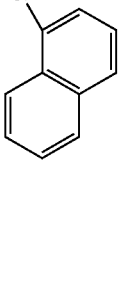
Pc-M
M: Cu, Mg, AlCl, TiO, SnCl2, Zn, Sn, MnCl, GaCl, etc
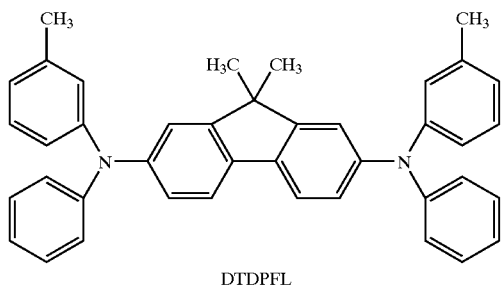
DTDPFL
TABLE 1-continued
[Hole-transporting materials (low-molecular weight)]
spiro-TPD
TPAC
PDA
TABLE 2
[Electron-transporting (luminescent) materials]
M: Al, Ga TABLE 2-continued
[Electron-transporting (luminescent) materials]
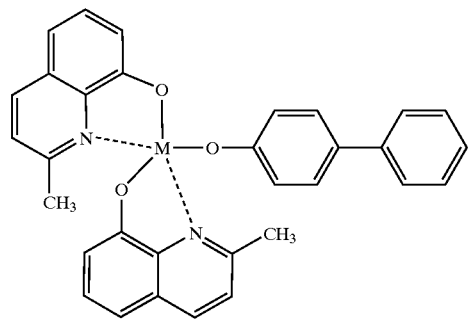
M: Al, Ga
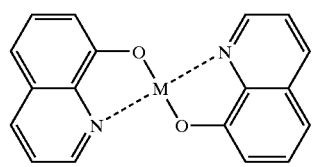
M: Zn, Mg, Be
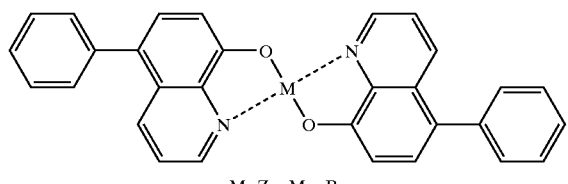
M: Zn, Mg, Be
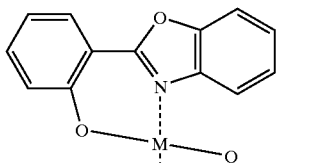
M: Zn, Mg, Be
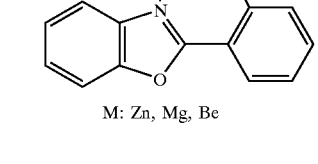
M: Zn, Mg, Be
TABLE 2-continued
[Electron-transporting (luminescent) materials]
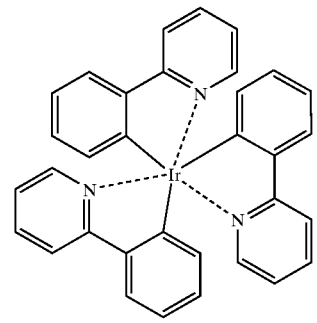
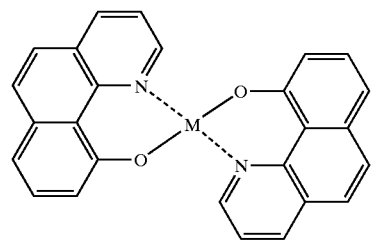
M: Zn, Mg, Be
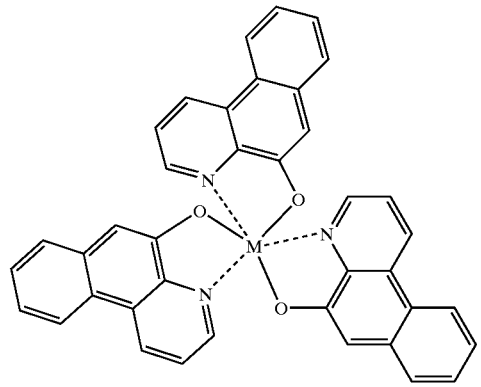
M: Al, Ga
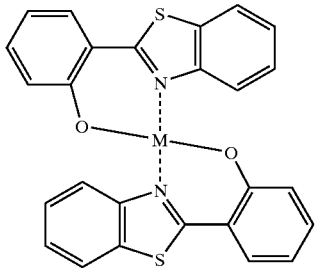

TABLE 3
[Luminescent materials]
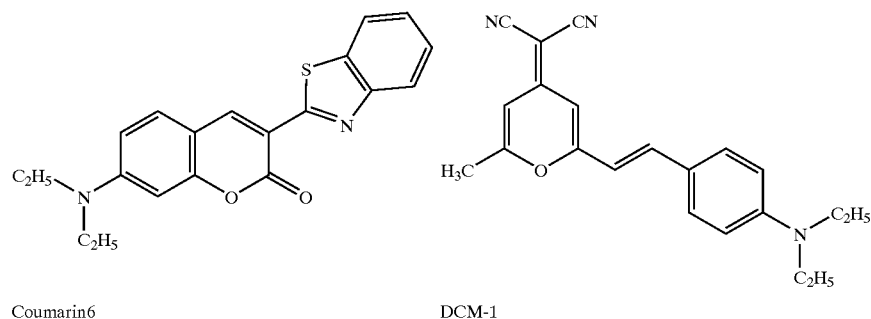
Coumarin6        DCM-1
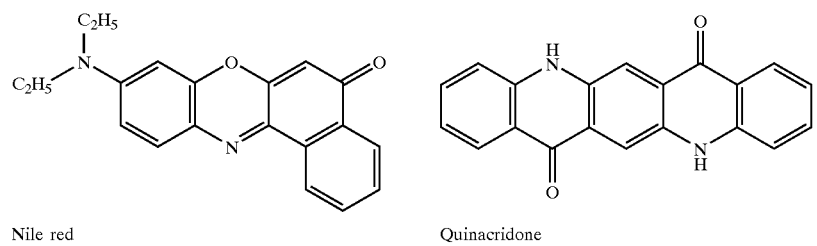
Nile red        Quinacridone
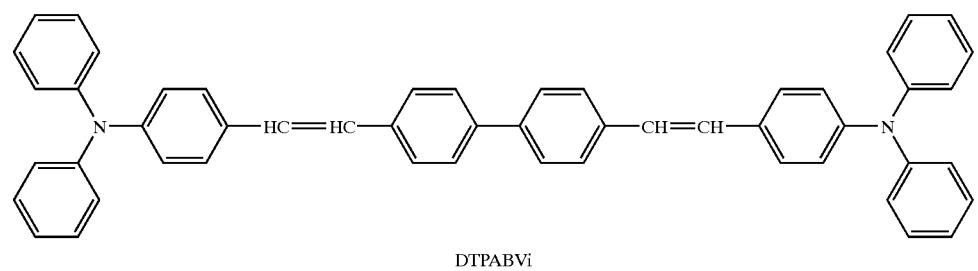
DTPABVi
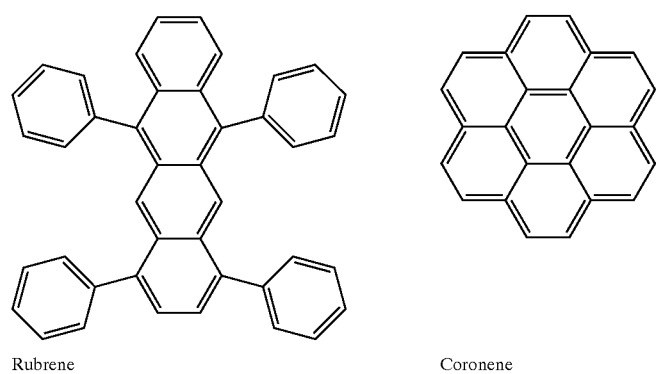
Rubrene        Coronene TABLE 4
[Electron-transporting (luminescent) materials]
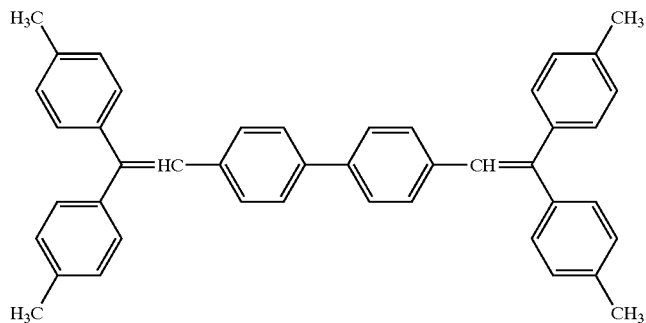
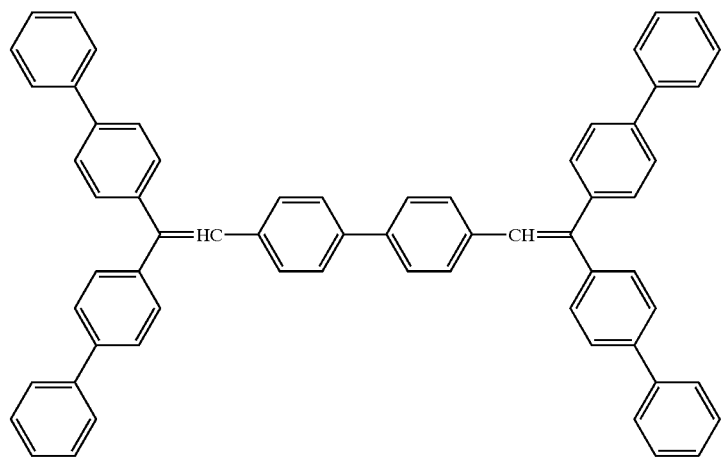
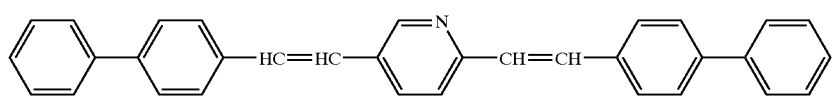
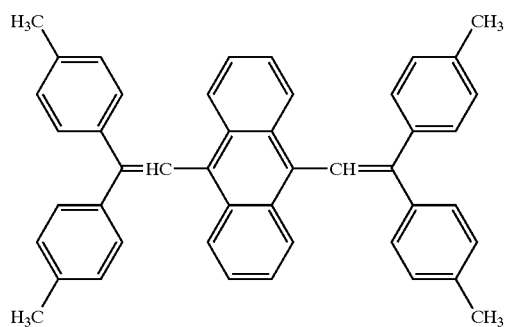
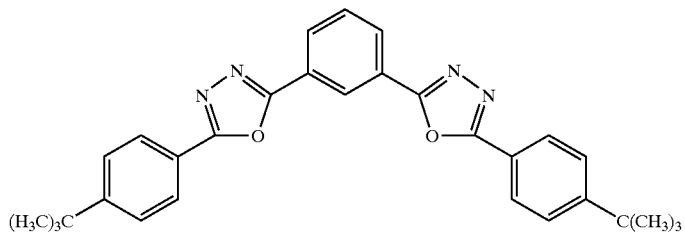

TABLE 4-continued
[Electron-transporting (luminescent) materials]
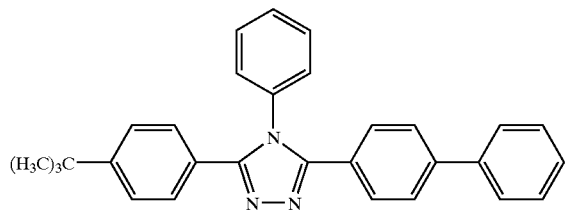
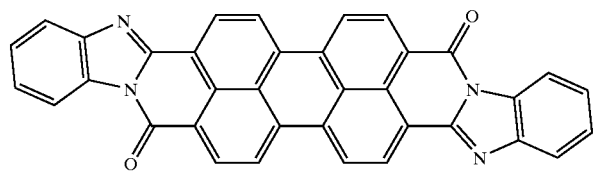
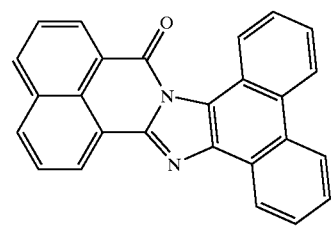
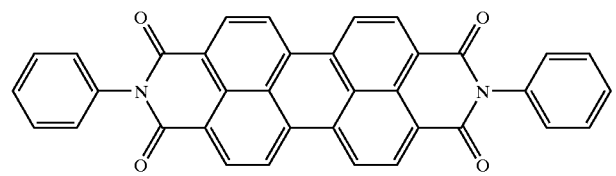
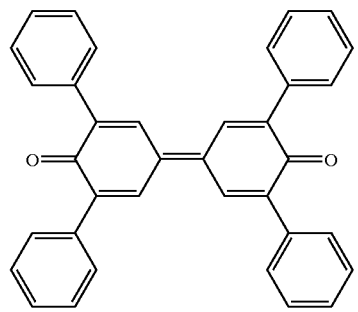

TABLE 5
[Hole-transporting material (polymeric)]
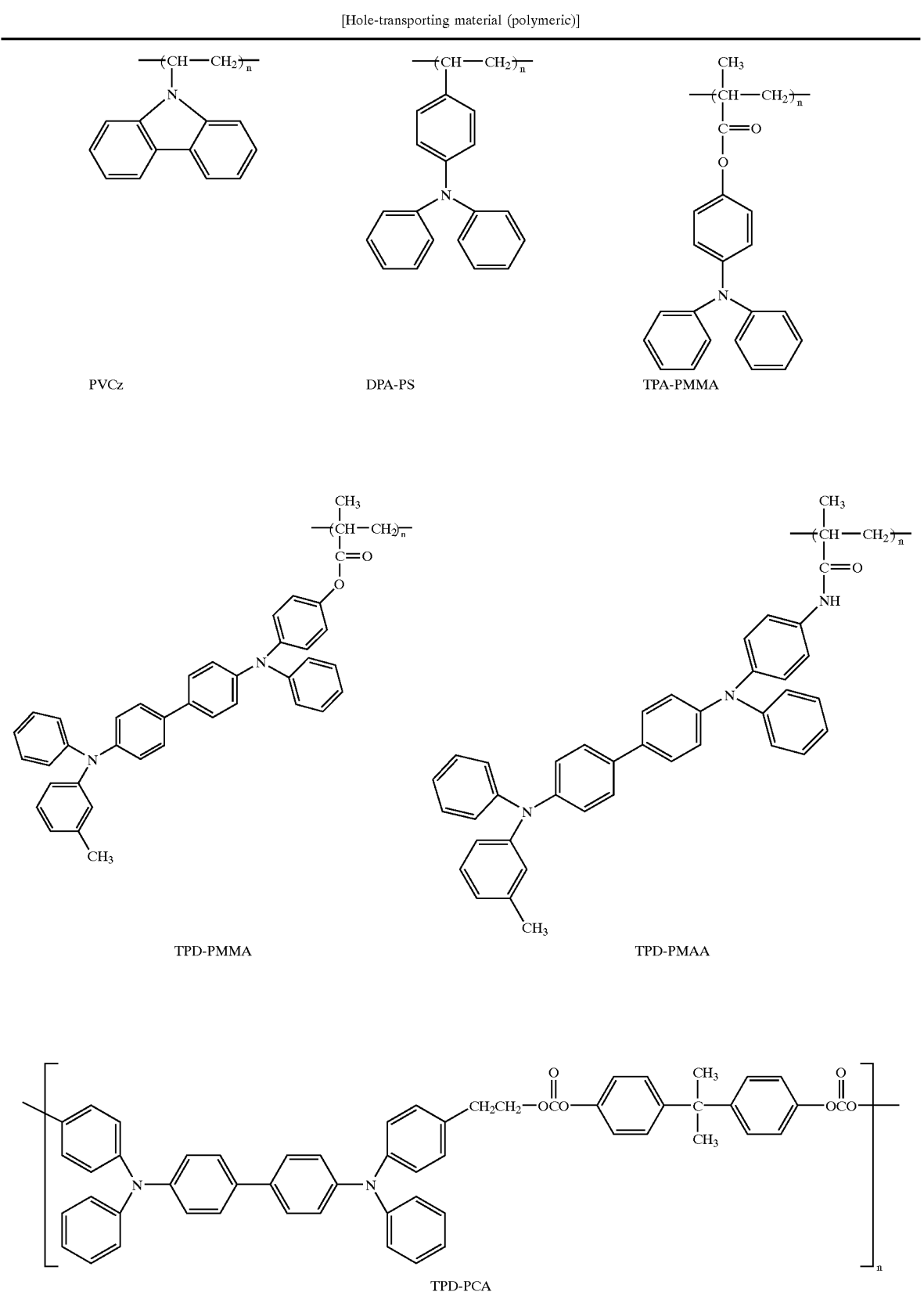
PVCz
DPA-PS
TPA-PMMA
TPD-PMMA
TPD-PMAA
TPD-PCA TABLE 5-continued

[Hole-transporting material (polymeric)]

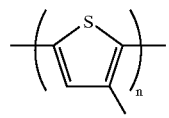

R: $C_6H_{13}$, $C_8H_{17}$, $C_{12}H_{25}$

Poly thiophene

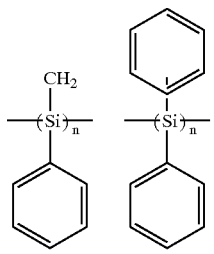

Poly silane

TABLE 6

[Polymeric luminescent (charge-transporting) materials]

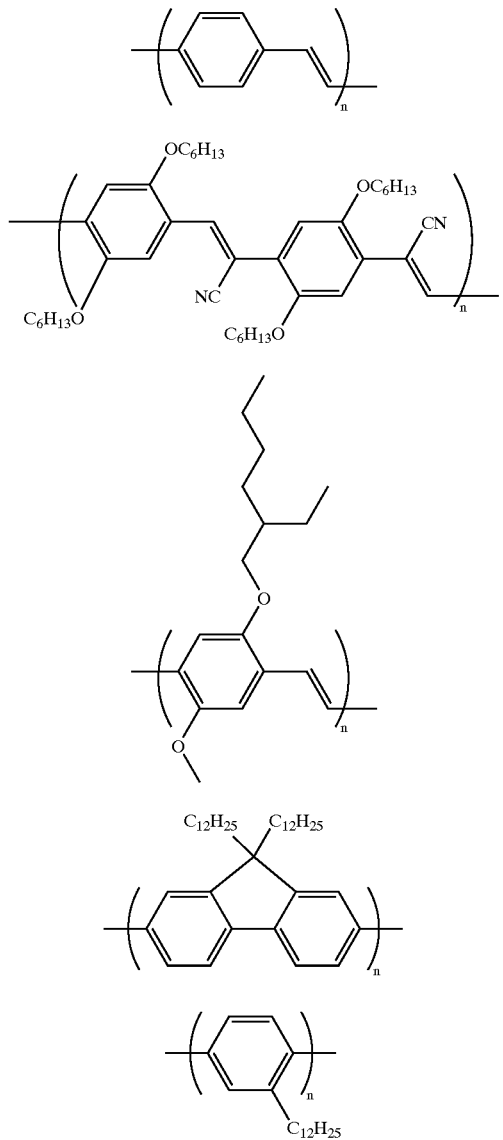

TABLE 6-continued

[Polymeric luminescent (charge-transporting) materials]

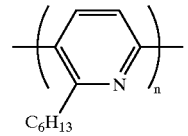

As mentioned above, the organic compound layer(s) containing the phenolic derivative of the formula (1-a), (1-b), (2-a) or (2-b) or other organic compound layers may be formed into film by vacuum deposition or coating of a solution of the relevant compound in an appropriate solvent. In the case of the solution coating, the organic compound can be used in mixture with an appropriate binder resin to form a film.

The binder resin used for the above purpose may be selected from a wide variety of scope. Examples thereof may include: polyvinyl carbazole resin, polycarbonate resin, polyester resin, polyarylate resin, polystyrene resin, acrylic resin, methacrylic resin, butyral resin, polyvinyl acetal resin, diallyl phthalate resin, phenolic resin, epoxy resin, silicone resin, polysulfone resin, and urea resin. These resins may be used singly or in combination of two or more species or in the form of copolymers.

As a material for the anode (2 shown in FIGS. 1–3), it is preferred to use one having as large a work function as possible, examples of which may include: metals, such as gold, platinum, nickel, palladium, cobalt, selenium and vanadium, and their alloys; metal oxides, such as tin oxide, zinc oxide, indium tin oxide (ITO), and indium zinc oxide; and electroconductive polymers, such as polyaniline, polypyrrole, polythiophene, and polyphenylene sulfide. These compounds may be used singly or in combination of two or more species.

On the other hand, as a material for the cathode (4 shown in FIGS. 1–3), it is preferred to use one having a small work function, examples of which may include: metals, such as lithium, sodium, potassium, calcium, magnesium, aluminum, indium, silver, lead, tin and chromium, and their alloys. It is also possible to use metal oxide, such as indium tin oxide (ITO). The cathode may be formed in a single layer or a lamination of plural layers.

The substrate 1 shown in FIGS. 1–3 for the organic luminescence device of the present invention may include an opaque substrate of metal, ceramics, etc., and a transparent substrate of glass, quartz, plastics, etc. It is possible to form the substrate with a color filter film, a fluorescent color conversion film, a dielectric reflection film, etc., thus controlling emitted luminescent light.

In order to prevent contact with oxygen and/or moisture, the organic luminescence device of the present invention may further include a protective layer or a sealing layer. Examples of the protective layer may include: an inorganic film of diamond, metal oxide, metal nitride, etc.; a polymer film of fluorine-containing resin, polyparaxylene, polyethylene, silicone resin, polystyrene, etc., and a film of light-curable resin. It is also possible to effect packaging of the organic luminescence device per se with a sealing resin while covering the organic luminescence device with glass, gas-impermeable film, metal, etc.

Hereinbelow, the present invention will be described more specifically based on Examples.

EXAMPLE 1

An electroluminescence device of a structure as shown in FIG. 3 was prepared in the following manner.

A 0.7 mm-thick glass substrate (substrate 1) coated with a 120 nm-thick film of ITO (indium tin oxide) (anode 2) formed by sputtering was successively washed with acetone and isopropyl alcohol (IPA) under application of ultrasonic wave and then washed with IPA under boiling, followed by cleaning by UV/ozone (i.e., irradiation with ultraviolet rays in the ozone-containing atmosphere), to obtain a transparent conductive substrate (including the substrate 1 and the ITO anode 2 formed thereon).

As a solution for a hole transport layer 5, 0.5 wt. % of TPD (N,N'-diphenyl-N,N'-m-tolyl-4,4'-diamino-1,1'-biphenyl) represented by a structural formula shown below was dissolved in chloroform.

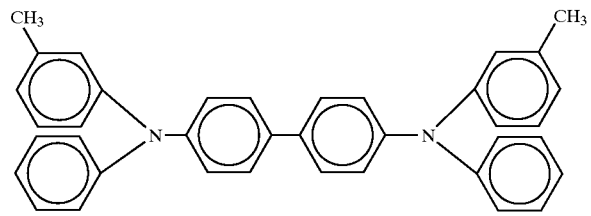

The thus-prepared solution was spin-coated on the above-prepared transparent conductive substrate for 10 sec at 500 rpm (1st coating) and then for 1 min. at 1000 rpm (2nd coating), followed by drying for 10 min. at 80° C. in a vacuum oven to completely remove the solvent, thus forming a 50 nm-thick TPD film (hole transport layer).

On the TPD film, a 50 nm-thick film of Alq 3 (tris-(8-quinolinolato)aluminum) (luminescence layer 3) was formed by vacuum deposition under a vacuum of $4.0 \times 10^{-4}$ Pa and at a film thickness growth rate of 0.3 nm/sec.

On the Alq 3 film, a 5 nm-thick film for a phenolic derivative (Example Compound No. 1) (electron injection (transport) layer 6) and a 150 nm-thick aluminum (Al) film (cathode 4) were successively formed by vacuum deposition under a vacuum of $4.0 \times 10^{-4}$ Pa and at a film thickness growth rate of 1.0–1.2 nm/sec, thus obtaining an organic luminescence device having a structure shown in FIG. 3 according to the present invention.

The thus-prepared organic luminescence device was covered with a protective plate of glass so as not to cause moisture absorption leading to a device deterioration, followed by sealing with an acrylic resin-based adhesive, in a dry air atmosphere.

The resultant organic luminescence device (effective luminescence area: 4 mm$^2$) was supplied with a DC voltage at an increment of 0.1 volt (V) from a power supply ("R-6144", available from Advantest Co.) to measure a device current (by "DMM2700", available from Keithley Co.) and a (luminescence) luminance (by "BM-7 fast", available from Topcon Co.), thereby to evaluate device characteristics in the following manner in terms of a drive voltage, a luminescence efficiency, an initial applied voltage, an initial luminance, an applied voltage after continuous luminescence, and a luminance after continuous luminescence.

<Drive Voltage>

The drive voltage was evaluated as a voltage (V) providing a luminance of 100 cd/m$^2$.

<Luminescence Efficiency>

The luminescence efficiency was evaluated as a value (cd/A) at the luminance of 100 cd/m$^2$.

<Applied Voltage and Luminance>

The organic luminescence device was continuously supplied with a constant current of 3.1 mA (current density of 100 mA/cm$^2$) for 240 hours (continuous luminescence test).

At an initial stage and after the continuous luminescence test (continuous current application for 240 hours), a voltage (V) applied to the organic luminescence device and a resultant luminance (cd) were measured, respectively.

The results are shown in Table 7 appearing hereinafter.

Comparitive Example 1

An organic luminescence device was prepared and evaluated in the same manner as in Example 1 except that the film of phenolic derivative (Ex. Comp. No. 1) (electron transport layer 6) was not formed, i.e., the Al film was directly formed on the Alq 3 film.

The results are shown in Table 7.

Comparitive Example 2

An organic luminescence device was prepared and evaluated in the same manner as in Example 1 except that the phenolic derivative film (Ex. Comp. No. 1) was changed to a 1 nm-thick LiF film (which was ordinarily used as an electron injection (transport) film of a conventional organic luminescence device).

The results are shown in Table 7 below.

TABLE 7

| Ex. No. | Drive voltage (V) | Luminescence efficiency (cd/A) | Voltage and luminance Initial (V); (cd) | After 240 H (V); (cd) |
|---|---|---|---|---|
| Ex. 1 | 4.5 | 4.1 | 8.2; 3800 | 8.7; 3600 |
| Comp. Ex. 1 | 14.2 | 0.7 | 17.5; 1100 | 29.0; 50 |
| Comp. Ex. 2 | 4.7 | 3.6 | 8.8; 3600 | 9.8; 2600 |

As apparent from the above results, the phenolic derivative (Ex. Comp. No. 1) used in the present invention was found to function as an electron injection material to exhibit better performances than the conventional material (LiF), thus improving a low-voltage drive characteristic and a luminescence efficiency while effectively suppressing an increase in drive voltage and a lowering in luminance in the continuous luminescence test.

This may be attributable to a function of Li in the phenolic derivative (Ex. Comp. No. 1) that electrons are effectively transferred from the Al electrode (cathode 4) to the Alq 3 film (luminescence layer 3). In this regard, LiF is an insulating material, thus exhibiting a smaller electron-transporting performance. On the other hand, it is considered that the phenolic derivative used in the present invention has a higher electron-transporting performance, thus effectively suppressing a lowering in electron-transporting performance in the continuous luminescence test.

When a similar evaluation was performed as to organic luminescence devices using phenolic derivatives (Ex. Comp. Nos. 2–66), all the organic luminescence device using the phenolic derivatives exhibited better performances (such as better electron-transporting (or injection) performance and better luminescence performance in the continuous luminescence test) than the organic luminescence devices prepared in Comparative Examples 1 and 2. Further, the organic luminescence device using phenolic derivatives containing K or Li caused less deterioration in material (thermal decomposition) particularly in the vacuum deposition step.

EXAMPLE 2

An organic luminescence device was prepared and evaluated in the same manner as in Example 1 except that the electron injection (transport) layer 6 (the film of phenolic derivative (Ex. Comp. No. 1)) was changed to a 20 nm-thick co-deposition film of Alq 3 and a phenolic derivative (Ex. Comp. No. 4) formed by adjusting a film thickness growth rate while changing a current passing through a slide boat so as to provide the phenolic derivative (Ex. Comp. No. 4) with a concentration of 10 vol. %.

The results are shown in Table 8 below.

TABLE 8

| Ex. No. | Drive voltage (V) | Luminescence efficiency (cd/A) | Voltage and luminance | |
|---|---|---|---|---|
| | | | Initial (V); (cd) | After 240 H (V); (cd) |
| Ex. 2 | 4.1 | 4.5 | 7.8; 4200 | 8.2; 4100 |

As apparent from the above results, the phenolic derivative (Ex. Comp. No. 4) used in the present invention was found to exhibit excellent electron injection performance and luminescence durability when the phenolic derivative was used in combination with Alq 3 (electron-transporting material) for constituting a co-deposited film as an electron injection film.

Similar good results were also attained when the concentration of the phenolic derivative (Ex. Comp. No. 4) was in the range of 5–90 vol. % and the thickness of the co-deposited film was in the range of 5–100 nm.

When a similar evaluation was performed as to organic luminescence devices using other phenolic derivatives (Ex. Comp. Nos. 1–3 and 5–138), all the organic luminescence devices using the phenolic derivatives exhibited better performances (such as better electron injection and luminescence durability) than the organic luminescence devices prepared in Comparative Examples 1 and 2.

Further, when Alq 3 used in combination with the phenolic derivative (Ex. Comp. No. 4) in the co-deposited film was changed to electron-transporting materials shown in Table 2, similar improvements in performances were confirmed.

Further, when the phenolic derivative (Ex. Comp. No. 4) was used in combination with Alq 3 for forming a co-deposited film in a concentration of 0.1–10 vol. %, a resultant electron-transporting performance was improved, i.e., a luminescence initiation voltage (drive voltage) was lowered.

Industrial Applicability

As described above, the organic luminescence device according to the present invention using a phenolic derivative represented by any one of the above-mentioned formulas (1-a), (1-b), (2-a) and (2-b) provides a high luminescence efficiency and a prolonged luminescence life, particularly, in the case where an organic layer using the phenolic derivative is used singly or in combination with another compound as a layer exhibiting an electron-transporting and/or injection performance.

What is claimed is:

1. An organic luminescence device, comprising:
a pair of an anode and a cathode, and
at least one organic layer disposed between the anode and the cathode, wherein
said at least one organic layer comprises a layer comprising at least one species of a phenolic derivative represented by the following formula (1-a) or (1-b):

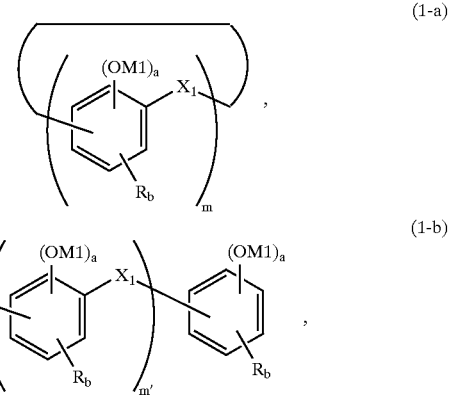

wherein
R denotes a substituent selected from the group consisting of a hydrogen atom, a halogen atom, a nitro group, a nitrile group, a substituted silyl group, a substituted or unsubstituted alkyl group, a substituted or unsubstituted alkenyl group, a substituted or unsubstituted aralkyl group, a substituted or unsubstituted aryl group, a substituted or unsubstituted amino group, a substituted or unsubstituted azomethine group, a substituted or unsubstituted carbonyl group, a substituted or unsubstituted alkoxy group, a substituted or unsubstituted ether group, and a substituted or unsubstituted heterocyclic group;
M1 denotes an alkali metal;
m is an integer of 2–100;
m' is an integer of 1–100;
a is an integer of 1–4; and b is an integer of 0–3, with the proviso that a+b is from 1 to 4, inclusive; and X1 denotes a divalent group selected from the group consisting of a single bond, an alkylene group having 1–10 carbon atoms, -(alkylene)-(NH or a substituted nitrogen)-, -(alkylene)-O—, -(alkylene)-S—, —NH— or a substituted nitrogen, —O—, —S—, —SO—, —SO$_2$—, a polysulifide having 2–10 sulfur atoms, a polysulfoxide having 2–10 sulfur atoms, a polysulfone having 2–10 sulfur atoms, —CO— and —COO—.

2. An organic luminescence device, comprising:
a pair of an anode and a cathode, and
at least one organic layer disposed between the anode and the cathode, wherein
said at least one organic layer comprises a layer comprising at least one species of a phenolic derivative represented by the following formula (2-a) or (2-b):

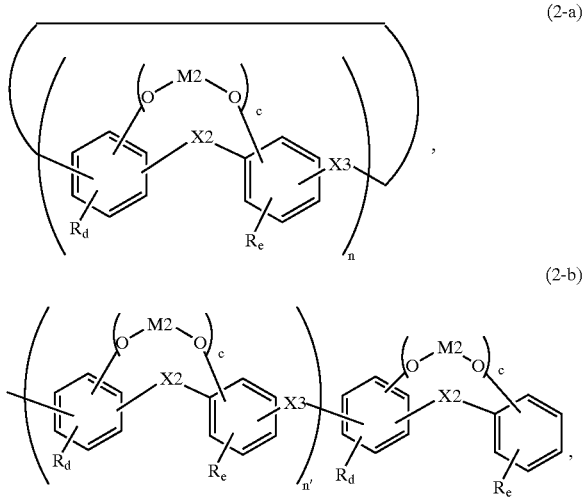

wherein
R denotes a substituent selected from the group consisting of a hydrogen atom, a halogen atom, a nitro group, a nitrile group, a substituted silyl group, a substituted or unsubstituted alkyl group, a substituted or unsubstituted alkenyl group, a substituted or unsubstituted aralkyl group, a substituted or unsubstituted aryl group, a substituted or unsubstituted amino group, a substituted or unsubstituted azomethine group, a substituted or unsubstituted carbonyl group, a substituted or unsubstituted alkoxy group, a substituted or unsubstituted ether group, and a substituted or unsubstituted heterocyclic group;

M2 denotes an alkali earth metal;

n is an integer of 1–50;

n' is an integer of 0–50;

c is an integer of 1 or 2 with the proviso that when c is 2, there are two divalent groups of the formula —O-M2-O— individually joining two benzene rings; and d and e are an integer of 0–3, with the proviso that c+d is from 1 to 4, inclusive, and c+e is from 1 to 4, inclusive;

X2 denotes a divalent group selected from the group consisting of a single bond, an alkylene group having 1–10 carbon atoms, -(alkylene)-(NH or a substitued nitrogen)-, -(alkylene)-O—, -(alkylene)-S—, —NH— or substituted nitrogen, —O—, —S—, —SO—, —SO$_2$—, —CO— and —COO—; and X3 denotes a divalent group selected from the group consisting of a single bond, an alkylene group having 1–10 carbon atoms, -(alkylene)-(NH or a substituted nitrogen)-, -(alkylene)-O—, -(alkylene)-S—, —NH— or a substituted nitrogen, —O—, —S—, —SO—, —SO$_2$—, a polysulfide having 2–10 sulfur atoms, a polysulfoxide having 2–10 sulfur atoms, a polysulfone having 2–10 sulfur atoms, —CO— and —COO—.

3. An organic luminescence device according to claim 1 or 2, wherein the layer comprising said phenolic derivative is a co-deposited film of said phenolic derivative and another compound or a film comprising a polymer and said phenolic compound dispersed therein.

4. An organic luminescence device according to claim 1 or 2, wherein said organic layer further comprises a luminescence layer, and the layer comprising said phenolic derivative is disposed between the cathode and the luminescence layer.

5. An apparatus comprising an organic luminescence device according to claim 1 or 2 and means for applying an electric field to the organic luminescence device.

* * * * *

UNITED STATES PATENT AND TRADEMARK OFFICE
CERTIFICATE OF CORRECTION

| | |
|---|---|
| PATENT NO. | : 6,998,182 B2 |
| APPLICATION NO. | : 10/385460 |
| DATED | : February 14, 2006 |
| INVENTOR(S) | : Akihito Saitoh et al. |

It is certified that error appears in the above-identified patent and that said Letters Patent is hereby corrected as shown below:

COLUMN 2

Line 52, "R" should read --$R_b$--.

COLUMN 3

Line 50, "R denotes" should read --$R_d$ and $R_e$ denote--.

COLUMN 32

Line 1, "or" should read --for--; and
   Line 41, "or" should read --for--.

COLUMN 33

Line 6, "or" should read --for--.

COLUMN 35

Line 53, "SnC12" should read --$SnCl_2$--.

COLUMN 50

Line 33, "Comparitive" should read --Comparative--; and
   Line 42, "Comparitive" should read --Comparative--.

COLUMN 52

Line 50, "R" should read --$R_b$--.

UNITED STATES PATENT AND TRADEMARK OFFICE
CERTIFICATE OF CORRECTION

PATENT NO. : 6,998,182 B2
APPLICATION NO. : 10/385460
DATED : February 14, 2006
INVENTOR(S) : Akihito Saitoh et al.

It is certified that error appears in the above-identified patent and that said Letters Patent is hereby corrected as shown below:

COLUMN 53

Line 39, "R denotes" should read --$R_d$ and $R_e$ denote-.

Signed and Sealed this

Twenty-second Day of August, 2006

JON W. DUDAS
*Director of the United States Patent and Trademark Office*